United States Patent
Kaneko et al.

(10) Patent No.: US 7,520,680 B2
(45) Date of Patent: Apr. 21, 2009

(54) LIGHT-RECEIVING ELEMENT, MANUFACTURING METHOD FOR THE SAME, OPTICAL MODULE, AND OPTICAL TRANSMITTING DEVICE

(75) Inventors: Tsuyoshi Kaneko, Shimosuwa-machi (JP); Hajime Onishi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 88 days.

(21) Appl. No.: 11/593,487

(22) Filed: Nov. 7, 2006

(65) Prior Publication Data

US 2007/0058909 A1 Mar. 15, 2007

Related U.S. Application Data

(62) Division of application No. 10/761,274, filed on Jan. 22, 2004, now Pat. No. 7,150,568.

(30) Foreign Application Priority Data

Feb. 6, 2003 (JP) ............................... 2003-029655

(51) Int. Cl.
*G02B 6/36* (2006.01)
(52) U.S. Cl. ..................... 385/88; 438/64; 359/665; 398/212; 257/432
(58) Field of Classification Search ............ 385/88–94; 438/48, 64, 65, 492, 493, 497; 359/642, 359/665; 398/212; 257/E31.12, E31.128, 257/E33.073, 431–433
See application file for complete search history.

(56) References Cited

U.S. PATENT DOCUMENTS

| 4,501,637 | A | * | 2/1985 | Mitchell et al. ............... 438/27 |
| 4,689,291 | A | * | 8/1987 | Popovic et al. ............... 430/321 |
| 5,269,867 | A | | 12/1993 | Arai |
| 5,498,684 | A | | 3/1996 | Bender |
| 5,707,684 | A | | 1/1998 | Hayes et al. |
| 5,723,264 | A | | 3/1998 | Robello et al. |
| 6,043,481 | A | * | 3/2000 | Tan et al. ..................... 250/216 |
| 6,060,113 | A | | 5/2000 | Banno et al. |
| 6,761,925 | B2 | | 7/2004 | Banno et al. |
| 6,838,361 | B2 | | 1/2005 | Takeo |
| 6,909,554 | B2 | | 6/2005 | Liu et al. |
| 7,064,907 | B2 | * | 6/2006 | Kaneko ..................... 359/811 |
| 2001/0048968 | A1 | | 12/2001 | Cox et al. |
| 2003/0076649 | A1 | | 4/2003 | Speakman |
| 2005/0030399 | A1 | | 2/2005 | Suzuki et al. |

FOREIGN PATENT DOCUMENTS

| EP | 336574 A1 | 10/1989 |
| JP | A 62-260104 | 11/1987 |
| JP | A 63-124583 | 5/1988 |

(Continued)

*Primary Examiner*—Sung H Pak
*Assistant Examiner*—Daniel Petkovsek
(74) *Attorney, Agent, or Firm*—Oliff & Berridge, PLC

(57) ABSTRACT

To provide a light-receiving element that is capable of high-speed operation and includes an optical element with controlled setting position, shape and size, a manufacturing method for the light-receiving element, and an optical module and an optical transmitting device including the light-receiving element, a light-receiving element includes a base member provided over a light-receiving surface, and an optical element provided on a top surface of the base member.

17 Claims, 14 Drawing Sheets

FOREIGN PATENT DOCUMENTS

| | | |
|---|---|---|
| JP | A 63-269580 | 11/1988 |
| JP | A 01-120874 | 5/1989 |
| JP | A 04-303801 | 10/1992 |
| JP | A 5-102513 | 4/1993 |
| JP | A 5-120722 | 5/1993 |
| JP | A 05-129638 | 5/1993 |
| JP | A 09-152503 | 6/1997 |
| JP | A 2000-67449 | 3/2000 |
| JP | A 2000-156485 | 6/2000 |
| JP | A 2000-304906 | 11/2000 |
| JP | A 2001-199644 | 7/2001 |
| JP | A 2001-320081 | 11/2001 |
| JP | 2002-169004 | 6/2002 |
| JP | A 2002-222962 | 8/2002 |
| JP | A 2002-331532 | 11/2002 |
| JP | 2002-353511 | 12/2002 |
| JP | A 2002-350606 | 12/2002 |
| JP | A 2003-031785 | 1/2003 |
| JP | A 2003-066299 | 3/2003 |
| JP | A 2002-100758 | 4/2005 |

* cited by examiner

LIGHT-RECEIVING ELEMENT, MANUFACTURING METHOD FOR THE SAME, OPTICAL MODULE, AND OPTICAL TRANSMITTING DEVICE

This is a Division of application Ser. No. 10/761,274 filed Jan. 22, 2004, now issued as U.S. Pat. No. 7,150,568 B2 on Dec. 19, 2006. The disclosure of the prior application is hereby incorporated by reference herein in its entirety.

BACKGROUND OF THE INVENTION

1. Field of Invention

The present invention relates to a light-receiving element and its manufacturing method, and an optical module and an optical transmitting device including the light-receiving element.

2. Description of Related Art

A light-receiving element is an element to receive light and converting the light into electricity, which is used for optical communication and optical operation, for example. In some of these applications, the need to control optical properties, such as radiation angle and wavelength of light, arises. In addition, in recent years, when a light-receiving element is applied to optical communication, higher-speed operation has been required for the light-receiving element.

SUMMARY OF THE INVENTION

The present invention provides a light-receiving element capable of high-speed operation including an optical element whose setting position, shape, and size are controlled, and its manufacturing method.

The present invention also provides an optical module and an optical transmitting device including the light-receiving element A first light-receiving element according to the present invention includes: a base member provided over a light-receiving surface; and an optical element provided on the top surface of the base member.

The "optical element" refers to a member having a function of changing optical properties and a traveling direction of light entering the light-receiving surface of the light-receiving element. The "optical properties" include wavelength, polarization, and radiation angle, for example. As such an optical element, a lens or polarizing element is an example.

The "base member" refers to a member having a top surface on which the optical element is set. Hence, the "top surface of the base member" refers to the surface on which the optical element is set. The top surface of the base member may be either plane or curved, provided that the optical element is set thereon.

The base member may be set directly on the light-receiving surface of the light-receiving element, or may be set over the light-receiving surface with another layer interposed. In the latter case, the another layer can, for example, be an antireflective layer, which has the function of reducing or preventing reflection of light on the light-receiving surface.

According to the first light-receiving element of an aspect of the present invention, by having the above-described structure, the light-receiving element capable of high-speed operation including the optical element whose setting position, shape, and size are advantageously controlled can be obtained.

According to one aspect of the present invention, the base member is composed of a material that allows light of a predetermined wavelength to pass. The "pass" refers to the light that enters the base member and subsequently emerging from the base member, and includes not only the case where all of the light entering the base member emerges from the base member, but also the case where only a part of the light entering the base member emerges from the base member.

According to an aspect of the present invention, the optical element can function as a lens or polarizing element.

According to an aspect of the present invention, the optical element can have a spherical shape or elliptical spherical shape.

According to an aspect of the present invention, the optical element can have a cut spherical shape or cut elliptical spherical shape. The "cut spherical shape" refers to a shape obtained by cutting a sphere in a plane, and the spherical shape includes not only a complete sphere but also an approximate sphere. In addition, the "cut elliptical spherical shape" refers to a shape obtained by cutting an elliptical sphere in a plane, and the elliptical spherical shape includes not only a complete elliptical sphere but also an approximate elliptical sphere.

In this case, a cross section of the optical element is circular or elliptical. Furthermore, in this case, a function as a lens or polarizing element is applied to the optical element.

According to an aspect of the present invention, the top surface of the columnar part is circular or elliptical.

According to an aspect of the present invention, a sealing agent can be formed so as to, at least, partially cover the optical element.

According to an aspect of the present invention, the top surface of the base member is curved.

According to an aspect of the present invention, the angle, formed between the top surface of the base member and the surface of side wall of the base member that contact the top surface, can be acute. Such a structure can reduce or prevent the side wall of the base member from getting wet by droplets during the step of discharging droplets to form the optical element precursor and the subsequent curing of the optical element precursor to form the optical element. As a result, an optical element of the preferred shape and size can be obtained reliably.

According to an aspect of the present invention, the upper portion of the base member can be formed into an inverse taper. The "upper portion of the base member" refers to the region of the base member that is close to the its top surface. Such a structure can preserve the stability of the base member during the step of discharging droplets to form the optical element precursor and the subsequent curing of the optical element precursor to form the optical element, and at the same time allows the angle formed, between the top surface of the base member and the side wall the of the base member, to be made even smaller. This will reduce or prevent the side wall of the base member from getting wet by the droplet. As a result, an optical element of the preferred shape and size can be obtained.

According to an aspect of the present invention, the light-receiving element is a photodiode.

According to an aspect of the present invention, the columnar part can include a first conductive type layer, a light-absorbing layer, and a second conductive type layer, and the light-absorbing layer being formed between the first conductive type layer and the second conductive type layer.

According to an aspect of the present invention, the base member can function as an anti-reflective layer.

According to an aspect of the present invention, the base member is composed of a semiconductor layer.

According to an aspect of the present invention, the base member is composed of an insulating material, which is silicon oxide or silicon nitride.

A second light-receiving element of an aspect of the present invention include a columnar part provided on a semiconductor substrate; a light-receiving surface provided on the top surface of the columnar part; a base member provided over the light-receiving surface; and an optical element provided on the top surface of the base member.

According to the second light-receiving element of an aspect of the present invention, the same actions and effects can be performed as in the first light-receiving element.

A third light-receiving element of an aspect of the present invention includes a columnar part provided on a semiconductor substrate; a light-receiving surface provided on the back surface of the semiconductor substrate; a base member provided over the light-receiving surface; and an optical element provided on the top surface of the base member.

According to the third light-receiving element of an aspect of the present invention, the same actions and effects can be performed as in the first light-receiving element.

A light-receiving element manufacturing method of an aspect of the present invention includes: a) forming a base member over a light-receiving surface; (b) forming an optical element precursor by discharging droplet onto the top surface of the base member; and (c) forming an optical element by curing the optical element precursor.

According to the manufacturing method of the light receiving element of an aspect of the present invention, in the step (a), the base member is formed with the shape of its top surface, its height and its setting position adjusted, while in the step (b), by adjusting the discharging amount of droplet, the light-receiving element, which is capable of high-speed operation including the optical element whose setting position, shape and size are advantageously controlled, can be provided.

According to an aspect of the present invention, in the step (a), the base member is formed from a material that allows light of a predetermined wavelength to pass. The "pass" means that after light enters the base member, the light exits the base member, and includes not only the case where all of the light entering the base member exits from the base member, but also the case where only a part of the light entering the base member exits from the base member.

According to an aspect of the present invention, in the step (a), the base member is formed so that the angle, formed between the top surface of the base member and the surface of the side wall of the base member that contacts the top surface of the base member, is acute. This will reduce or prevent the side wall of the base member from getting wet by droplets during the step (b). As a result, an optical element with the preferred shape and size is formed reliably.

According to an aspect of the present invention, in the step (a), the upper portion of the base member is formed into an inverse taper. This will preserve the stability of the base member and at the same time permit the angle, formed between the top surface and the side wall of the base member, to be made even smaller, which will reduce or prevent the side wall of the base member from getting wet by the droplets during the step (b). As a result, an optical element with the preferred shape and size can be formed more reliably.

According to an aspect of the present invention, the method can further include a step (d) adjusting the wettability of the top surface of the base member with respect to the droplet, prior to the step (b). This will allow the formation of an optical element with the preferred shape and size. In the step (d), the wettability of the top surface of the base member with respect to the droplet can be controlled, for example, by forming a lyophilic or liquid-repellent film with respect to the droplet on the top surface of the base member.

According to an aspect of the present invention, the method can further include a step (e) covering, at least, a part of the optical element with a sealing agent.

An aspect of the present invention can be applied to an optical module including the light-receiving element according to an aspect of the present invention and a light guide. Furthermore, an aspect of the present invention can be applied to an optical transmitting device including the optical module.

DETAILED DESCRIPTION OF EXEMPLARY EMBODIMENTS

Hereinafter, the preferred exemplary embodiments of the present invention will be described referring to the accompanying figures.

First Exemplary Embodiment

1. Structure of the Light-Receiving Element

Figure 1:
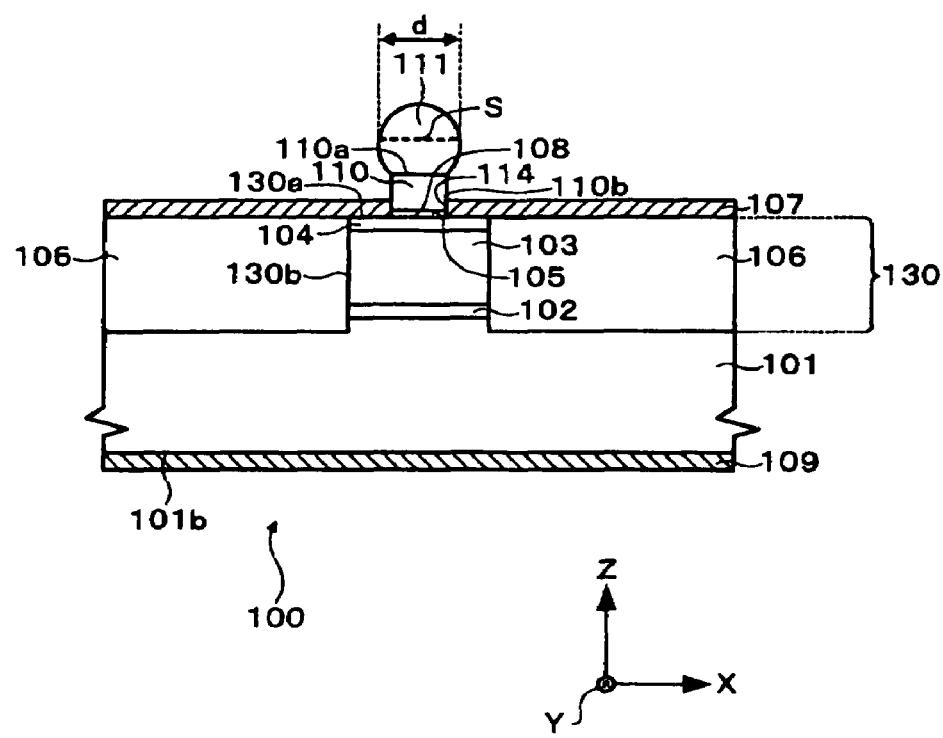
FIG. 1 is a schematic cross sectional view of the light-receiving element in a first exemplary embodiment of the present invention.
Figure 2:
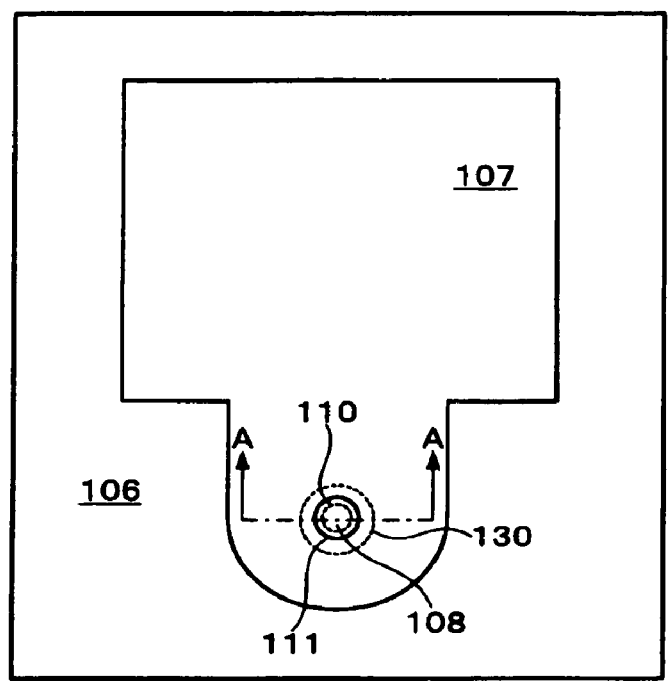
FIG. 2 is a schematic plan view of the light-receiving element in the first exemplary embodiment of the present invention.
Figure 2:
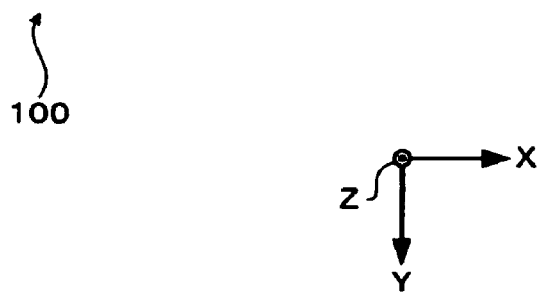

FIG. 1 is a schematic cross sectional view showing a light-receiving element 100 according to a first exemplary embodiment of the present invention. FIG. 2 is a schematic plan view showing the light-receiving element 100 according to the first exemplary embodiment of the present invention. FIG. 1 shows a cross section taken along the plane A-A of FIG. 2. As for the exemplary embodiment, the case where the light-receiving element 100 is a photodiode will be described.

As shown in FIG. 1, the light-receiving element 100 includes a light-receiving surface 108, a base member 110 provided over the light-receiving surface 108, and an optical element 111 provided on a top surface 110a of the base member 110.

As for the light-receiving element 100 of the present exemplary embodiment, light enters through the light-receiving surface 108, which is provided on a top surface 130a of a columnar part 130 formed on a semiconductor substrate 101. Thus, the top surface 130a of the columnar part 130 includes the light-receiving surface 108. More specifically, on the top surface 130a of the columnar part 130, a portion (opening 114), which is not covered by a first electrode 107 (described below), is provided, and the light-receiving surface 108 is provided within the opening 114.

Furthermore, as for the exemplary embodiment, the case where the optical element 111 functions as a lens will be described. That is, as shown in FIGS. 1 and 2, the light converged by the optical element 111 enters the light-receiving surface 108 through the base member 110.

Base Member

As for the present exemplary embodiment, the base member 110 is made of a material that can transmit light of a predetermined wavelength. More specifically, the base member 110 is made of a material that can transmit the light that is converged by the optical element 111. For example, the base member 110 is formed from polyimide resin, acrylic resin, epoxy resin or fluorocarbon resin. Alternatively, the base member is formed from a semiconductor layer, as in a light-receiving element 400 (refer to FIG. 15) of a fourth exemplary embodiment described below.

As for the present exemplary embodiment, FIG. 1 shows the case where the base member 110 and an anti-reflective layer 105 are separate layers, but alternatively, the base member 110 itself is rendered to function as an anti-reflective layer, instead of providing the separated anti-reflective layer 105. In this case, the base member 110 is made of a material that can effect a reduction of the reflection of the incident light, as well as transmit the incident light. More specifically, in this case, the base member 110 is made of an insulator such as silicon oxide and silicon nitride.

There is no particular restriction on the three-dimensional shape of the base member 110, but the base member should, at least, have a structure that the optical element can be set on its top surface. The same requirement is applied to base members of light-receiving elements in the other exemplary embodiments to be described below.

The height and shape of the base member 110 are determined by the function, application, shape and size of the optical element 111 that is formed on the top surface 110a of the base member 110. Accordingly, by controlling the shape of the top surface 110a of the base member 110, the shape of the optical element 111 can be controlled.

For example, as for the light-receiving element 100 (refer to FIGS. 1 and 2), the shape of the top surface 110a of the base member 110 is circular. The other exemplary embodiments, which are described below, also show cases that the shapes of the top surface of the base members are circular.

When the optical element is used, for example, as a lens or polarizing element, the shape of the top surface of the base member is circular. This allows the three-dimensional shape of the optical element to be a spherical shape or cut spherical shape, thereby the resultant optical element is used as a lens or polarizing element.

Although a figure is not shown here, when the optical element is used as an anisotropic lens or polarizing element, the shape of the top surface of the base member can be elliptical. This allows the three-dimensional shape of the optical element to be formed as an elliptical spherical shape or cut elliptical spherical shape, thereby the resultant optical element 111 is used as a lens or polarizing element.

Optical Element

Because the three-dimensional shape of the optical element 111 is described above, a detailed description will be omitted.

The optical element 111 is formed by curing a curable liquid material (e.g. a precursor of UV-cured resin or thermosetting resin) with applying energy, such as heat and light. As for the UV-cured resin, UV-curable acrylic resin and epoxy resin are exemplified. As for the thermosetting resin, thermosetting polyimide resin or the like are exemplified.

The precursor of UV-cured resin is cured by a short-time ultraviolet irradiation. Accordingly, the UV-cured resin can be cured without going through the step such as heating in which the element is apt to be damaged. Thus, when the optical element 111 is formed using the precursor of UV-cured resin, influence on the element can be reduced.

Figure 9:
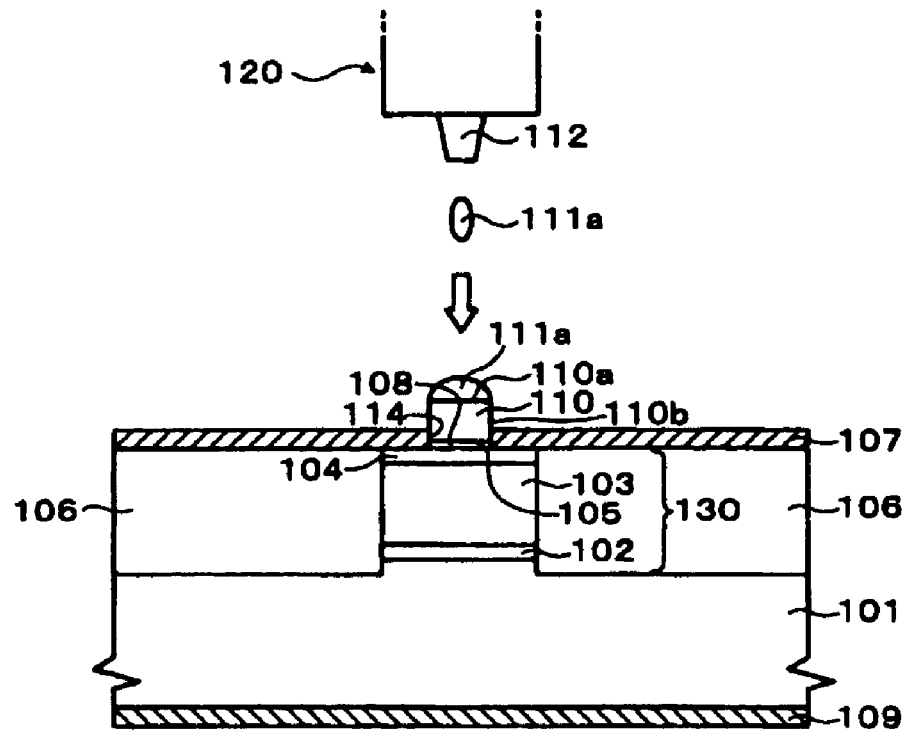
FIG. 9 is a schematic cross sectional view of a step in the manufacturing of the light-receiving element shown in FIGS. 1 and 2.
Figure 10:
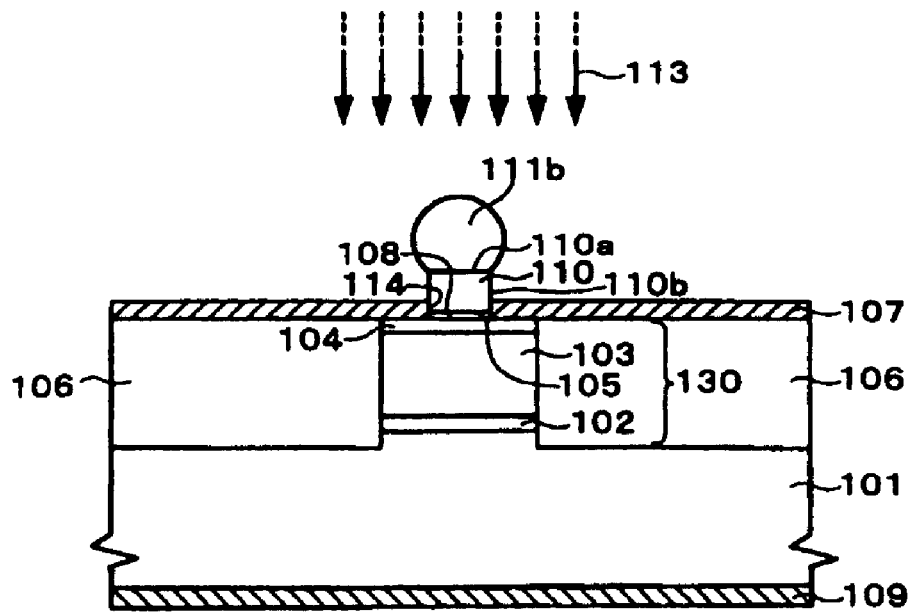
FIG. 10 is a schematic cross sectional view of a step in the manufacturing of the light-receiving element shown in FIGS. 1 and 2.

As for the present exemplary embodiment, specifically, the optical element 111 is formed by discharging a droplet 111a made of the liquid material on the top surface 110a of the base member 110 to form an optical element precursor 111b and curing the optical element precursor 111b (refer to FIGS. 9 and 10). A method to form the optical element 111 will be described below.

FIG. 1 shows the case where the maximum width "d" of the optical element 111 at its maximum cross section "S" is larger than the diameter of the base member 110. This allows a large distance between the upper portion of the curved surface of the optical element 111 (surface of the optical element 111) and the light-receiving surface 108. As a result, the lens effect of the optical element can be enhanced. The shape and size of the optical element 111 are not limited to those shown in FIG. 1; the maximum width d of the optical element 111 at its maximum cross section "S" is equal to or smaller than the diameter of the base member 110. This is similarly applied to optical elements in other exemplary embodiments described below.

The "maximum cross section S" means a cross section that has the largest area among cross sections that can be obtained by cutting the optical element 111 in planes parallel to the light-receiving surface 108. The "maximum width d at maximum cross section S" refers to the maximum width of the optical element at its maximum cross section S as defined above. When the maximum cross section S is, for example, circular, d is the diameter of the circle defined by the maximum cross section S, while when the maximum cross section S is elliptical, d is the major axis of the ellipse defined by the maximum cross section S.

Other Components

As above described, the light-receiving element 100 includes a semiconductor substrate 101, and a columnar part 130 that is formed over the semiconductor substrate 101. The semiconductor substrate 101 is composed of n-type GaAs substrate.

The columnar part 130 is a columnar semiconductor deposition structure that is formed on the semiconductor substrate 101. More specifically, the columnar part 130 is formed by etching a portion in the light-receiving element 100 from the light-receiving surface 108 side to the middle of the substrate 101 so as to form a circular shape as viewed from the light-receiving surface 108 side. As for the present exemplary embodiment, although the plane shape of the columnar part 130 is circular, the shape may take any other shape.

The columnar 130 includes a first conductive type layer 102, a light-absorbing layer 103, and a second conductive type layer 104. As for the light-receiving element 100 according to the exemplary embodiment, the light-receiving surface 108 is provided on the second conductive type layer 104. Accordingly, light entering the second conductive type layer 104 through the light-receiving surface 108 propagates in the second conductive type layer 104 and then enters the light-absorbing layer 103. In this case, the columnar part 130 can be formed by depositing, for example, the first conductive type layer 102 made of an n-type GaAs layer, the light-absorbing layer 103 made of a GaAs layer with no impurities doped, and the second conductive type layer 104 made of a p-type GaAs layer on the substrate 101 made of an n-type GaAs layer, in the order described as above. In this case, for example, the first conductive type layer 102 can have a film thickness of 0.5 µm, the light-absorbing layer 103 can have a film thickness of 3.5 µm, and the second conductive type layer 104 can have a film thickness of 0.1 µm. However, the compositions and thickness of respective layers composing the first conductive type layer 102, the light-absorbing layer 103, and the second conductive type layer 104 are not limited to the above-described example.

The second conductive type layer 104 is made into the p-type, for example, by doping C (carbon), and the first conductive type layer 102 is made into the n-type, for example, by doping Si (silicone). Thus, a pin diode is composed of the second conductive type layer 104, the light-absorbing layer 103 in which impurities are not doped, and the first conductive type layer 102.

The second conductive type layer 104 has a carrier density so that it can take an ohmic contact with an electrode (the first electrode 107 described below).

Furthermore, the columnar part 130 is embedded with an insulating layer 106. That is, a side wall 130b of the columnar part 130 is encompassed with the insulating layer 106. As for the light-receiving element 100 according to the exemplary embodiment, the insulating layer 106 covers the side wall 130b of the columnar part 130 and the top surface of the substrate 101.

In the manufacturing steps of the light-receiving element 100, after the insulating layer 106 covering the side wall 130b of the columnar part 130 is formed, the first electrode 107 is formed on the top surface 130a of the columnar part 130 and the top surface of the insulating layer 106, and a second electrode 109 is formed on the back surface of the semiconductor substrate 101 (the surface opposite to the surface of the semiconductor substrate 101, on which the columnar part 130 is set). When forming these electrodes, an annealing treatment is generally carried out at about 400° C. (refer to the manufacturing step described below). Accordingly, in the case where the insulating layer 106 is formed using resin, the resin composing the insulating layer 106 needs to be excellent in heat resistance so as to withstand the annealing treatment. In order to satisfy this requirement, the resin composing the insulating layer 106 is preferably polyimide resin, fluorocarbon resin, acrylic resin, or epoxy resin, more preferably polyimide resin or fluorocarbon resin from the viewpoint of easiness in processing and insulation performance. Furthermore, in the case where the optical element (e.g. lens) is formed on the insulating layer 106 using resin as a raw material, the insulating layer 106 is preferably made of polyimide resin or fluorocarbon resin from the viewpoint of large contact angle with the lens material (resin) and easiness in controlling the lens shape. In this case, the insulating layer 106 is formed by curing a resin precursor with energy irradiation, such as heat and light, or by chemical reaction.

The first electrode 107 is composed of a multi-layered film of an alloy of Au and Zn, and Au, for example.

Furthermore, the second electrode 109 is formed on the back surface 101b of the semiconductor substrate 101. That is, as for the light-receiving element 100, the top surface 130a of the columnar part 130 contacts the first electrode 107, and the back surface 101b of the semiconductor substrate 101 contacts the second electrode 109. The second electrode 109 is composed of a multi-layered film of an alloy of Au and Ge, and Au, for example.

The materials to form the first electrode 107 and the second electrode 109 are not limited to the above-described examples. For example, metals of Ti, Pt or the like, or alloys of these metals are applicable.

Furthermore, as shown in FIG. 1, the anti-reflective layer 105 is formed on the light-receiving surface 108, as required. Thus, as for the light-receiving element 100 of the present exemplary embodiment, the base member 110 is set on the light-receiving surface 108 with the anti-reflective layer 105 interposed. Because this can reduce the reflection of the incident light on the light-receiving surface 108, the injection efficiency of the light entering the light-receiving surface 108 can be increased.

An optical film thickness of the anti-reflective layer 105 is expressed in $(2m-1)\lambda/4$ ($\lambda$ represents a wavelength of light entering the light-receiving surface 108 (incident light) and m represents a natural number). The "optical film thickness" refers to a value obtained by multiplying an actual film thickness of the layer by a refraction factor thereof. For example, when the wavelength of incident light is $\lambda$ and a layer has an optical film thickness of $\lambda/4$ and a refraction factor n of 2.0, the actual film thickness of this layer is expressed in $\lambda/4/2=0.125\lambda$ by the fact that the actual film thickness is equal to optical film thickness/refraction factor n. "Film thickness" in the invention refers to an actual film thickness of a layer.

Materials of the anti-reflective layer 105 are not specifically limited, however, they may be materials that have an effect of reducing the reflection factor of the incident light and allow the incident light to pass therethrough. For example, the anti-reflective layer 105 is made of a silicon oxide or silicon nitride.

Furthermore, in the light-receiving element 100, a reflective layer (not shown) is formed between the first conductive type layer 102 and the light-absorbing layer 103, as required. By forming the reflective layer, light which passed through the light-absorbing layer 103 can be reintroduced to the light-absorbing layer 103. This can increase the light utilizing efficiency. In particular, when the film thickness of the light-absorbing layer 103 is reduced, a part of incident light passes through the light-absorbing layer 103, thereby decreasing the light utilizing efficiency in the light-absorbing layer 103. In this case, forming the reflective layer is effective from the viewpoint of increasing the light utilizing efficiency.

2. Operation of the Light-Receiving Element

General operation of the light-receiving element 100 according to the exemplary embodiment is described below. The case where the first conductive type is of n-type and the second conductive type is of p-type is described. The method to drive the light-receiving element described below is only an example, and various modifications can be made without departing from the intent of the present invention.

First, light having a predetermined wavelength enters the optical element 111. The incident light is converged by the optical element 111 and enters the light-receiving surface 108. The incident light through the light-receiving surface 108 generates the light excitation in respective layers constituting the columnar part 130 (semiconductor layer) to generate electrons and positive holes. At this time, in the light-absorbing layer 103, the electrons are accumulated in the vicinity of an interface with the first conductive type layer 102, and the positive holes are accumulated in the vicinity of an interface with the second conductive type layer 104. When more than a predetermined amount of electrons and positive holes are accumulated in the light-absorbing layer 103, the electrons move to the first conductive type layer 102, and the positive holes move to the second conductive type layer 104. As a result, a current flows in the direction from the first conductive type layer 102 to the second conductive type layer 104 (a direction Z in FIG. 1). At this time, if an electric field is impressed to the light-absorbing layer 103 so that a potential on the side of the first conductive type layer 102 becomes high, the separation of generated electrons and positive holes becomes easy and the probability of recombination is reduced, thereby increasing the photoelectric conversion efficiency.

3. Manufacturing Method of Light-Receiving Element

Next, an example of the manufacturing method of the light-receiving element 100 according to the first exemplary embodiment of the present invention will be described referring to FIGS. 3 through 10. FIGS. 3 through 10 are schematic cross sectional views, each showing a manufacturing step of the light-receiving element 100 according to the exemplary embodiment as shown in FIGS. 1 and 2, and corresponding to the cross section shown in FIG. 1.

Figure 3:
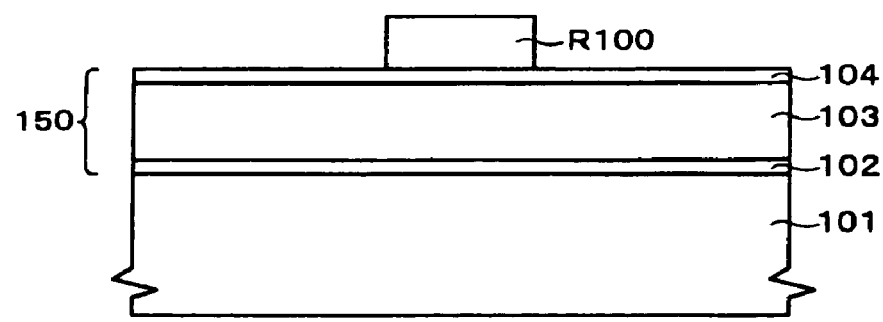
FIG. 3 is a schematic cross sectional view of a step in the manufacturing of the light-receiving element shown in FIGS. 1 and 2.

(1) First, on the surface of the semiconductor substrate 101 made of n-type GaAs, a semiconductor multilayer film 150 is formed by generating epitaxial growth while modulating the composition (refer to FIG. 3).

As shown in FIG. 3, the semiconductor multilayer film 150 is composed by depositing the first conductive type layer 102, the light-absorbing layer 103, and the second conductive type layer 104 in the order described as above. Furthermore, each of the layers is made of GaAs. In this case, the first conductive type layer 102 is doped with Si (silicone) so as to be of n-type and the second conductive type layer 104 is doped with C (carbon) so as to be of p-type. Furthermore, the reflective layer (not shown) is made to grow in a predetermined position, as required.

Although the temperature for the epitaxial growth is determined in each case in accordance with growth method, raw material, type of the semiconductor substrate 101, or type, thickness, and carrier density of the semiconductor multilayer film 150 to be formed, in general, the temperature is in the range of 450 to 800° C., preferably. The time required for the epitaxial growth is also determined in each case as in the temperature. Furthermore, as a method of epitaxial growth, MOVPE (Metal-Organic Vapor Phase Epitaxy) method, MBE (Molecular Beam Epitaxy) method, or LPE (Liquid Phase Epitaxy) method can be used.

Subsequently, after applying photoresist (not shown) on the semiconductor multilayer film 150, a resist layer R100 of a predetermined pattern is formed by patterning the photoresist using a photolithography method (refer to FIG. 3).

Figure 4:
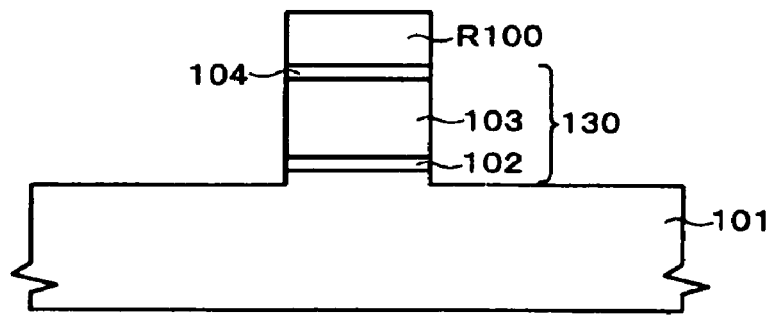
FIG. 4 is a schematic cross sectional view of a step in the manufacturing of the light-receiving element shown in FIGS. 1 and 2.

(2) Thereafter, by partially etching (e.g. dry etching method) the second conductive type layer 104, the light-absorbing layer 103, the first conductive type layer 102, and the semiconductor substrate 101 using the resist layer R100 as a mask, the columnar semiconductor deposition structure (columnar part) 130 is formed (refer to FIG. 4). Thereafter, the resist layer R100 is removed.

Figure 5:
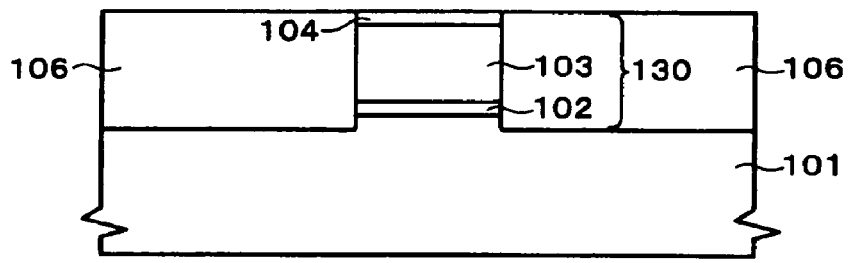
FIG. 5 is a schematic cross sectional view of a step in the manufacturing of the light-receiving element shown in FIGS. 1 and 2.

(3) Subsequently, the insulating layer 106 encompassing the columnar part 130 is formed (refer to FIGS. 5 and 6). The case where polyimide resin is used as a material for forming the insulating layer 106 will be described.

First, a resin precursor layer (polyimide precursor) is applied on the semiconductor substrate 101, for example, using a spin coat method, to effect imidization. Thereby, the insulating layer 106 is formed around the columnar part 130 as shown in FIG. 5. As for the forming method of the insulating layer 106, for example, the method given in Japanese laid-open patent publication No. 13-066299 can be used. As for the forming method of the resin precursor layer, in addition to the above-described spin coat method, suitable techniques, such as dipping method, spray coat method, and an ink jet method, can be used.

Figure 6:
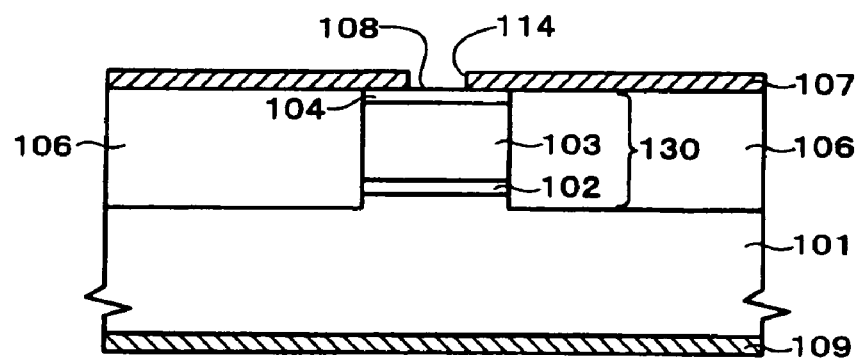
FIG. 6 is a schematic cross sectional view of a step in the manufacturing of the light-receiving element shown in FIGS. 1 and 2.

(4) Next, the first electrode 107 and the second electrode 109, and the light-receiving surface 108 are formed (refer to FIG. 6).

First, before the first electrode 107 and the second electrode 109 are formed, the top surface 130a of the columnar 130 is cleaned using a plasma treatment method or the like, as required. This enables an element having more stable properties to be formed. Subsequently, after a multi-layered film (not shown) made of an alloy of Au and Zn, and Au, for example, is formed on the top surface of the insulating layer 106 and the top surface 130a of the columnar part 130 using the vacuum deposition method, for example, a portion (opening 114), which does not have the multi-layered film formed thereon, is formed on the top surface 130a of the columnar part 130 using the lift off method. This allows the region inside of the opening 114 to function as the light-receiving surface 108. Incidentally, in the above-described step, the dry etching method can be used instead of the lift off method.

Furthermore, a multi-layered film (not shown) made of, for example, an alloy of Au and Ge, and Au, is formed on the back surface of the semiconductor substrate 101 using the vacuum deposition method, for example, and then is subjected to an annealing treatment, thereby forming ohmic contact. The temperature of the annealing treatment depends on the electrode material. Typically, the electrode material used in the exemplary embodiment is treated at about 400° C. Through the above-described steps, the first electrode 107 and the second electrode 109 are formed (refer to FIG. 6).

Subsequently, the anti-reflective layer 105 is formed on the light-receiving surface 108, as required (refer to FIG. 7).

Specifically, an insulating layer (not shown in the figures) to form the anti-reflective layer 105 is multi-layered by a method, such as plasma CVD, so that a layer of a predetermined thickness is produced. The description is given to the insulating layers composed of silicon nitride, but the insulating layers may be made of silicon oxide. Then the resist patterning is conducted by the photolithographic process so as to leave only resist over the light-receiving surface 108. Following that, portions of the insulating layers that are not covered by the resist are removed by the wet etching, for example, using buffered hydrofluoric acid solution as the etchant. The dry etching using fluorine plasma can be employed instead of the wet etching. Finally the resist is removed. The anti-reflective layer 105 can be obtained through the above-described steps.

Figure 7:
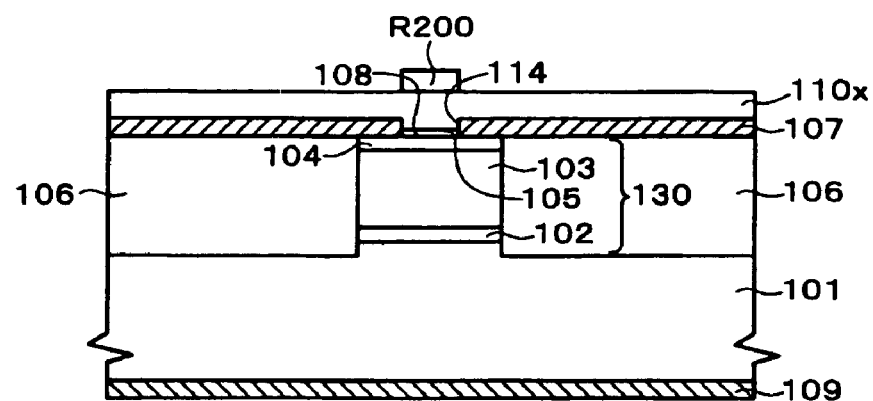
FIG. 7 is a schematic cross sectional view of a step in the manufacturing of the light-receiving element shown in FIGS. 1 and 2.
Figure 8:
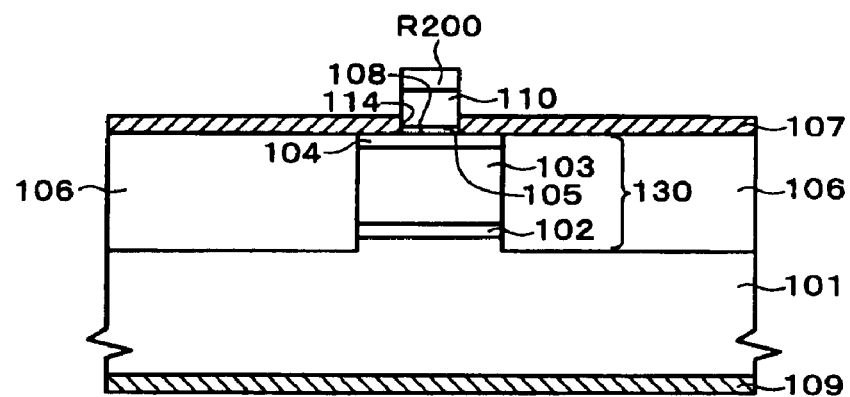
FIG. 8 is a schematic cross sectional view of a step in the manufacturing of the light-receiving element shown in FIGS. 1 and 2.

(5) Next, the base member 110, on which the optical element 111 (refer to FIG. 1) will be set, is formed over the light-receiving surface 108 (refer to FIGS. 7 and 8).

To form the base member 110, a method (e.g. the selective growth method, the dry etching, the wet etching, the lift-off method and the transfer method) can be selected that is appropriate for material, shape and size of the base member 110. As for the present exemplary embodiments, the case where the base member 110 is formed by patterning with the wet etching will be described.

First a resin layer 110x is formed over, at least, the light-receiving surface 108, as shown in FIG. 7. As for the present exemplary embodiment, the case where the resin layer 110x is formed over the light-receiving surface 108 and over the entire top surface of the first electrode 107 using the spin coat method, for example, is shown.

Subsequently, a resist layer R200 of a predetermined pattern is formed over the resin layer 110x. The resist layer R200 is used to form the base member 110, which is accomplished by patterning the resin layer 110x. Specifically, the resin layer 110x is patterned by the lithographic process employing the wet etching that uses the resist layer R200 as mask and, for example, an alkaline solution as the etchant. As a result, the base member 110 is formed over the light-receiving surface 108 as shown in FIG. 8. Afterwards, the resist layer R200 is removed.

(6) Next, the optical element 111 is formed on the top surface 130a of the columnar part 130 (refer to FIGS. 9 and 10). As for the present exemplary embodiments, the case where the optical element 111 is formed on the top surface 110a of the base member 110 via the first electrode 107 is shown.

First, a treatment to adjust a wet angle of the optical element 111 is conducted to the top surface 110a of the base member 110, as required. The treatment enables the optical element precursor 111b with a preferable shape to be obtained when the liquid material 111a is introduced on the top surface 110a of the base member 110 in the step described below. As a result, the optical element 111 having a preferable shape can be obtained (refer to FIGS. 9 and 10).

Subsequently, a droplet of the liquid material 111a is discharged onto the top surface 110a of the base member 110 using the ink jet method, for example. As for discharging methods of the ink jet, (i) a method of generating pressure by changing the sizes of bubbles in the liquid (lens material in the invention) with heat so as to discharge the liquid, and (ii) a method of generating pressure with a piezoelectric element so as to discharge the liquid, are exemplified. The method (ii) is preferable from the viewpoint of pressure controllability.

The alignment of the nozzle position of an ink jet head and the discharging position of the droplet is performed using suitable image recognition techniques used in an exposure process or inspection process in a general manufacturing process of semiconductor integrated circuit. For example, as shown in FIG. 9, the position of a nozzle 112 of an ink jet head 120 and the position of the columnar part 130 are aligned. After the alignment, the voltage applied to the ink jet head 120 is controlled and then the droplet of the liquid material 111a is discharged. Thereby, as shown in FIG. 10, the optical element precursor 111b is formed on the top surface 110a of the base member 110.

In this case, as shown in FIG. 9, the liquid material 111a is deformed due to surface tension when the droplet, discharged from the nozzle 112, lands on the top surface 110a of the base member 10, and the liquid material 111a comes to the center of the top surface 110a of the base member 110. Thereby, the position is automatically corrected.

Furthermore, in this case, the optical element precursor 111b (refer to FIG. 9) obtains a shape and size in accordance with the shape and size of the top surface 110a of the base member part 110, the discharging amount of the liquid material 111a, the surface tension of the liquid material 111a, and the interfacial tension between the top surface 130a of the columnar part 130 and the liquid material 111a. For example, the method of dispensing the droplet is repeated as many times as needed, to form the optical element 111 of the required shape and size. Accordingly, by controlling these factors, the shape and size of the optical element 111 obtained finally (refer to FIG. 1) can be controlled, thereby enhancing the flexibility in lens design.

After conducting the above-described steps, as shown in FIG. 10, the optical element precursor 111b is cured by irradiation of energy beam 113 (e.g. ultraviolet rays) to form the optical element 111 on the top surface 110a of the base member 110 (refer to FIG. 1). At this time, an optimal wavelength and amount of the ultraviolet rays depend on the material of the optical element precursor 111b. For example, in the case where the optical element precursor 111b is formed using a precursor of acrylic UV-cured resin, it is irradiated for five minutes by ultraviolet rays having a wavelength of about 350 nm and an intensity of 10 mW to be cured. Through the above-described steps, the light-receiving element 100 according to the exemplary embodiment can be obtained as shown in FIG. 1.

4. Actions and Effects

The light-receiving element 100 according to the exemplary embodiment has actions and effects described below.

(A) First, because the optical element 111 is formed on the top surface 110a of the base member 110, a amount of light per unit cross section area, which is introduced to the light-absorbing layer 103, can be increased. This allows the film thickness of the light-absorbing layer 103 to be thinner, thereby decreasing the distance that the electrons and the positive holes moves to the electrodes (the first electrode 107 and the second electrode 109). As a result, a high-speed operation becomes possible while maintaining the light-receiving sensitivity.

Furthermore, because the light-absorbing layer 103 has a high insulation performance in general, the capacitance of the light receiving element 100 is increased in proportional to the cross section area of the light-absorbing layer 103. The increase of capacitance is a factor preventing the high-speed operation of the element. By contrast, in the light receiving element 100 according to the exemplary embodiment, because the amount of light per unit cross section area, which is introduced to the light-absorbing layer 103, can be increased as above described, the cross section area of the light-absorbing layer 103 can be decreased. Because this can reduce the capacitance, higher-speed operation becomes possible while maintaining the light utilizing efficiency.

(B) Second, because the optical element 111 is provided on the top surface 110a of the base member 110, an appropriate path length can be secured for the light that enters through the light-receiving surface 108. That is, by adjusting the height of the base member 110, the path length for the light that enters through the light-receiving surface 108 (the incident light) can be adjusted. Thus, the curvature of the optical element 111 and the path length for the incident light can be controlled independently. Therefore, an optical design that will bring the incident light into the light-absorbing layer 103 with good efficiency can be conducted with ease.

(C) Third, the size and shape of the optical element 111 can be strictly controlled. In order to form the optical element 111, as described in the step (6), the optical element precursor 111b is formed on the top surface 110a of the base member 110 in the step of forming the optical element 111 (refer to FIGS. 9 and 10). At this time, as long as the side wall 110b of the base member 110 is not wetted with the liquid material composing the optical element precursor 110a, the surface tension of the top surface 110a of the base member 110 does not act on the optical element precursor 111b, but the surface tension of the liquid material mainly acts on the optical element precursor 111b. Therefore, the shape of the optical element precursor 111b can be controlled by controlling the amount of the liquid material (droplet 111a) used to form the optical element 111. Thereby, the optical element 111 whose shape is more strictly controlled can be formed. As a result, the optical element 111 having a preferred shape and size can be obtained.

(D) Fourth, the setting position of the optical element 111 can be strictly controlled. As above described, the optical element 111 is formed by discharging the droplet of the liquid material 111a onto the top surface 110a of the base member 110 to form the optical element precursor 111b and curing the optical element precursor 111b (refer to FIG. 10). In general, a strict control of the landing position of the discharged droplet is difficult. This method, however, allows the optical element 111 to be formed on the top surface 110a of the base member 110 without performing special alignment. That is, by only discharging the droplet 111a on the top surface 110a of the base member 110, the optical element precursor 111b can be formed without alignment. To put it differently, the optical element 111 can be formed with the alignment accuracy, which is applied when the base member 110 is formed. Thereby, the optical element 111 whose setting position is controlled can be formed with ease and with good yield.

In particular, in the case where the droplet 111a is discharged using the ink jet method, the droplet 111a can be discharged in a more precise position, so that the optical element 111 whose setting position is controlled more strictly can be formed with ease and with good yield. Furthermore, by discharging the droplet 111a using the ink jet method, the amount of the discharged droplet 111a can be controlled in units of pico-liter order, thereby a fine structure can be produced precisely.

(E) Fifth, by setting the shape and area of the top surface 110a of the base member 110, the shape and size of the optical element 111 can be set. In particular, by selecting the shape of the top surface 110a of the base member 110 in each case, the optical element 111 having a predetermined function can be formed. Moreover, by forming a plurality of base members having different shapes of top surface thereof, and forming each optical elements on the top surface of each of the base members, optical elements having different functions can be integrated on the same substrate.

5. Modification

Figure 11:
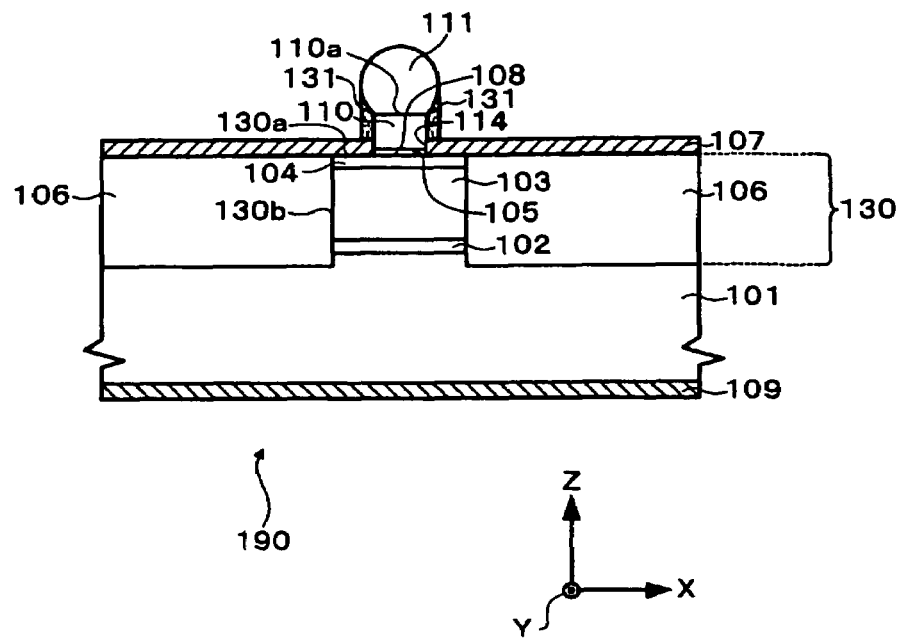
FIG. 11 is a schematic cross sectional view of a modification of the light-receiving element shown in FIGS. 1 and 2.

Next, a modification of the light-receiving element 100 of the present exemplary embodiment will be described with reference to FIG. 11. FIG. 11 is a schematic cross sectional view of a modification (light-receiving element 190) of the light-receiving element 100 of the present exemplary embodiment.

As shown in FIG. 11, as for a light-receiving element 190 of the modification, a sealing agent 131 is formed so as to, at least, partially cover the optical element 111. The sealing agent 131 heightens the adhesion strength of the optical element 111, so that the optical element 111 is securely fixed to the top surface 110a of the base member 110. The refractive factor of the sealing agent 131 is preferably lower than that of the optical element 111. There is no particular restriction on the material of the sealing agent, and resin can be used, for example.

Apart from the above aspects, the light-receiving element 190 in the modification has the same structure and the same actions and effects as the light-receiving element 100 of the present exemplary embodiment.

6. Another Modification

Figure 12:
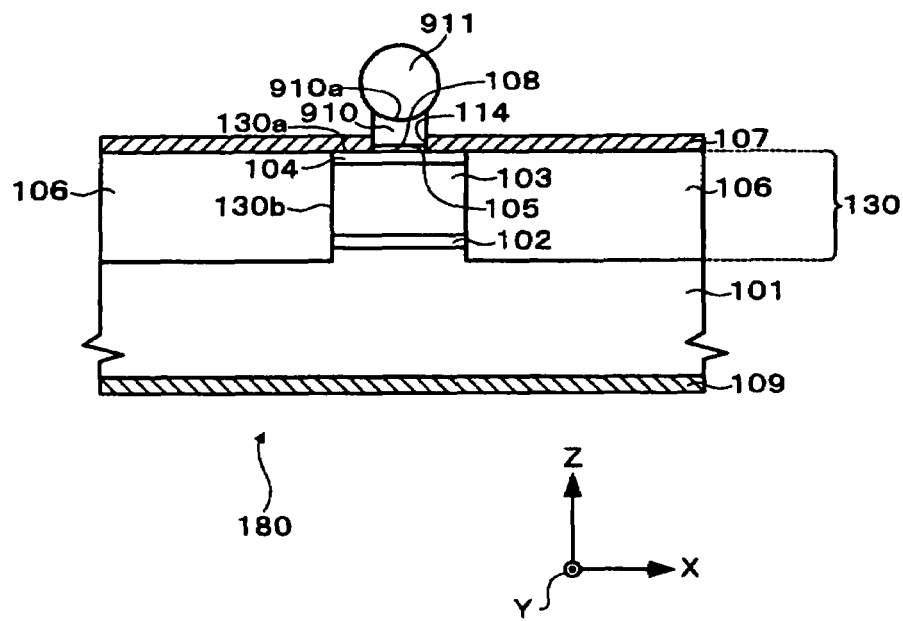
FIG. 12 is a schematic cross sectional view of another modification of the light-receiving element shown in FIGS. 1 and 2.

Next, another modification of the light-receiving element 100 of the present exemplary embodiment will be described with reference to FIG. 12. FIG. 12 is a schematic cross sectional view of the another modification (light-receiving element 180).

As shown in FIG. 12, as for a light-receiving element 180 of the modification, a top surface 910a of a base member 910 is curved. According to the structure, an optical element 911 with an approximate spherical shape can be set on the top surface 910a of the base member 910.

Apart from the above aspects, the light-receiving element 180 of the modification has the same structure and the same actions and effects as the light-receiving element 100 of the present exemplary embodiment. Also for light-receiving elements of other exemplary embodiments described below, the top surfaces of the base members is made curved in the same way as in the light-receiving element 180 shown in FIG. 12. In these cases also, an optical element with approximate spherical shape is set on the top surface of the base member in the same way as in the light-receiving element 180 shown in FIG. 12.

Second Exemplary Embodiment

1. Structure of the Light-Receiving Element

Figure 13:
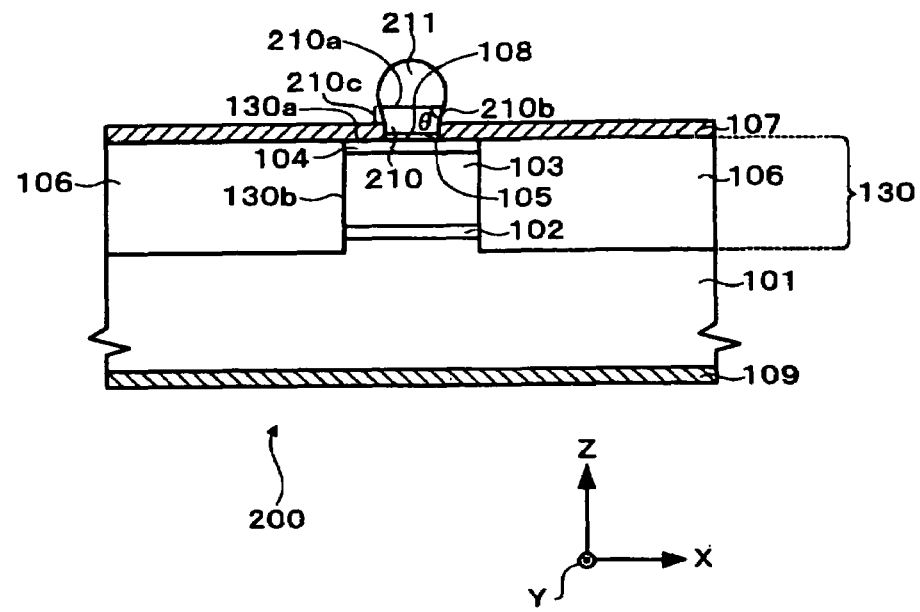
FIG. 13 is a schematic cross sectional view of the light-receiving element in a second exemplary embodiment of the present invention.

FIG. 13 is a schematic cross sectional view showing a light-receiving element 200 according to a second exemplary embodiment of the present invention. As for the exemplary embodiment, the case where the light-receiving element is a photodiode, as in the first exemplary embodiment, will be described.

The light-receiving element 200 of the present exemplary embodiment has almost the same structure as that of light-receiving element 100 of the first exemplary embodiment except that the upper portion of its base member 210 takes the form of an inverse taper. Accordingly, as for the structural elements of the light-receiving element 200, which are similar to those of the light-receiving element 100 according to the first exemplary embodiment, same reference numerals have been given, and a detailed description will be omitted.

As shown in FIG. 13, the angle of θ, formed between a top surface 210a and a surface 210b of a base member 210, can be set acute. That is, as for the base member 210, as above described, the upper portion 210c of the base member 210 is an inverse taper in shape. The "surface 210b" refers to the surface of the side wall of the base member 210 that contact with the top surface 210a.

The material of the base member 210 is the same as that of the base member 110 in the first exemplary embodiment. That is, the base member 210 is made of a material that can transmit light that enters the base member 210 through the optical element 211. Moreover, the structure, material and function of the optical element 211 are the same as those of optical element 111 in the first exemplary embodiment. Additionally, the optical element 211 can be formed using the same method as for the optical element 111 in the first exemplary embodiment.

2. Operation of the Light-Receiving Element

Because the operation of the light-receiving element 200 according to the exemplary embodiment is similar to that of the light-receiving element 100 according to the first exemplary embodiment, a detailed description will be omitted.

3. Method for Manufacturing the Light-Receiving Element

The method for manufacturing the light-receiving element 200 of the present exemplary embodiment is the same as that for light-receiving element 100 of the first exemplary embodiment except for forming of the upper portion of the base member 210 into an inverse taper for the light-receiving element 200. Accordingly, a detailed description will be omitted.

4. Actions and Effects

The light-receiving element 200 according to the exemplary embodiment and its manufacturing method have substantially the same actions and effects as the light-receiving element 100 according to the first exemplary embodiment and its manufacturing method. In addition, the light-receiving element 200 according to the exemplary embodiment and its manufacturing method take the following actions and effects.

The optical element 211 is formed by discharging droplets onto the top surface 210a of the base member 210 so as to form an optical element precursor (not shown), then causing the optical element precursor to be cured. In this case, because the angle of θ, formed between the top surface 210a and the surface 210b of the base member 210, is acute, when the droplet are discharged at the top surface 210a of the base member 210, wetting of the side wall of the base member 210 can be reduced or prevented. As a result, the optical element 211 with the preferred shape and size can be formed reliably.

Third Exemplary Embodiment

1. Structure of the Light-Receiving Element

FIG. 13 is a schematic cross sectional view showing a light-receiving element 300 according to a third exemplary embodiment of the present invention. As for the exemplary embodiment, the case where the light-receiving element is a photodiode, as in the first and second exemplary embodiments, will be described.

The light-receiving element 300 of the present exemplary embodiment has almost the same structure as that of light-receiving element 200 of the second exemplary embodiment, because an upper portion 310c of a base member 310 takes the form of an inverse taper. Accordingly, as for the structural elements of the light-receiving element 300, which are similar to those of the light-receiving element 200 according to the second exemplary embodiment, same reference numerals have been given, and a detailed description will be omitted.

As for the light-receiving element 300, the angle of θ, formed between the top surface 310a of the base member 310 and the surface 310b of the side wall of the base member 310 that contact with the top surface 310a, is smaller than that of the light-receiving element 200 of the second exemplary embodiment.

As described above, as for the light-receiving element 300 of the present exemplary embodiment, the upper portion 310c of the base member 310 takes the form of an inverse taper. More specifically, the angle of θ, formed between the top surface 310a of the base member 310 and the surface 310b of the side wall of the base member 310 that contact with the top surface 310a, is acute. The material of the base member 310 is the same as that of the base member 210 in the second exemplary embodiment. That is, the base member 310 is made of a material that can transmit light that enters the base member 310 through the optical element 311. Moreover, the structure, material and function of the optical element 311 are the same as those of the optical element 211 in the second exemplary embodiment. Additionally, the optical element 311 is formed using the same method as for the optical element 211 in the second exemplary embodiment.

2. Operation of the Light-Receiving Element

Because the operation of the light-receiving element 300 according to the exemplary embodiment is basically the same as those of the light-receiving elements 100 and 200 according to the first and second exemplary embodiments, a detailed description will be omitted.

3. Method for Manufacturing the Light-Receiving Element

The method for manufacturing the light-receiving element 300 of the present exemplary embodiment is the same as that for the light-receiving element 100 of the first exemplary embodiment except for forming of the base member 310 such that the upper portion 310c of the base member 310 is shaped as an inverse taper. Accordingly, the steps of the manufacturing method for the light-receiving element 300 that differ from the manufacturing method for the light-receiving element 100 of the first exemplary embodiment, that is, the steps for forming the base member 310 will be mainly described.

First, the same methods in the steps (1) through (4) (refer to FIGS. 3 through 6) of the method to manufacture the light-receiving element of the above-described first exemplary embodiment are used to form all of the parts of the light-receiving element 300 except the base member 310 and the optical element 311. Then, using a similar method to that in the above-described step (5) (refer to FIG. 7), a resin layer 110x is formed, and subsequently a resist layer R200 with a predetermined pattern is formed over the resin layer 110x.

The resist layer R200 will be employed in the subsequent step of patterning the resin layer 110x so as to form the base member 310.

Next, a thermal treatment is applied at a temperature level (e.g. 130° C.) that will not alter the properties of the resist. As for the thermal treatment, heat is applied at the top surface of the resin layer 110x so that the degree of curing of portions of the resin layer 110x that are close to its top surface (resist layer R200) becomes greater than that of portions that are close to the substrate 101.

Figure 14:
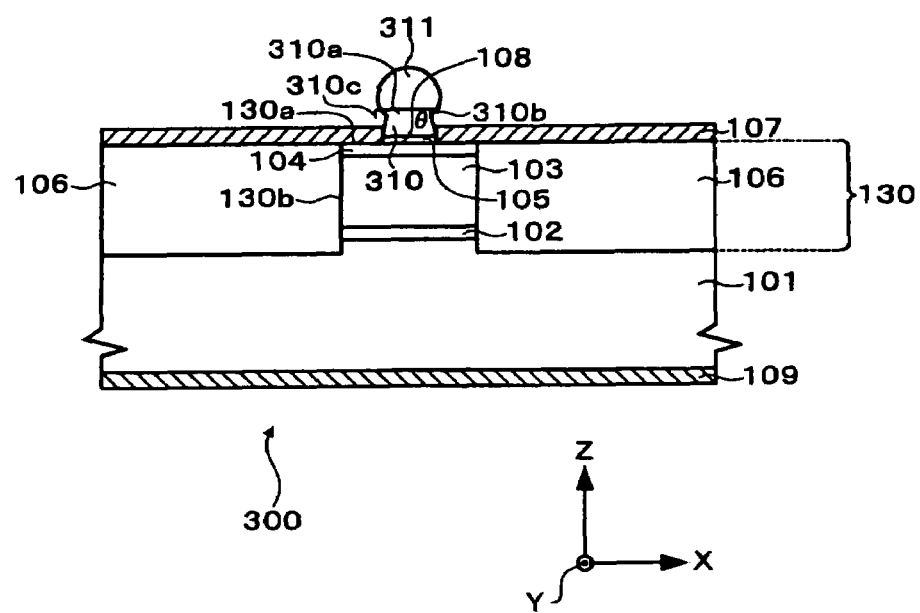
FIG. 14 is a schematic cross sectional view of the light-receiving element in a third exemplary embodiment of the present invention.

Next, the resin layer 110x is wet-etched using the resist layer R200 as a mask. In the step, the area immediately below the resist layer R200, that is, the upper portion of the resin layer 110x, is less susceptible of being etched compared with the other portions because the etchant penetrates it at a slow speed. Moreover, because of the above-described thermal treatment, the portions of the resin layer 110x that lie close to its top surface have been cured to a higher degree than its portions that lie close to the substrate 101, the etching rate in the wet etching process is lower for the portions of the resin layer 110x that lie close to its top surface than for its portions that lie close to the substrate 100. As a result, the portions of the resin layer 110x that lie close to its top surface are etched at a slower speed compared to its portions that lie close to the substrate 100 during the wet etching. This means that the portions of the resin layer 110x that lie close to its top surface are left in larger amounts compared with its portions that lie close to the substrate 100. Accordingly, the base member 310 with its upper portion 310c formed into an inverse taper shape (refer to FIG. 14) is obtained. Afterwards the resist layer R200 is removed.

Because the remaining steps (steps to form the optical element) are the same as the manufacturing method for the first exemplary embodiment (the step (6) of the first exemplary embodiment), a detailed description will be omitted. In this way, the light-receiving element 300 is obtained (refer to FIG. 14).

4. Actions and Effects

The light-receiving element 300 of the present exemplary embodiment and its manufacturing method have substantially the same actions and effects as the light-receiving element 100 of the first exemplary embodiment and its manufacturing method. Furthermore, the light-receiving element 300 of the present exemplary embodiment and its manufacturing method have the actions and effects described below.

According to the light-receiving element 300, the upper portion 310c of the base member 310 has the form of an inverse taper. This preserves the stability of the base member 310, while at the same time allowing the angle of θ, formed between the top surface 310a and the surface 310b of the base member 310, to be made even smaller. Therefore, the side wall of the base member 310 can be prevented from being wetted by the droplet more reliably. As a result, the optical element 311 of the preferred shape and size is formed.

Fourth Exemplary Embodiment

1. Structure of the Light-Receiving Element

Figure 15:
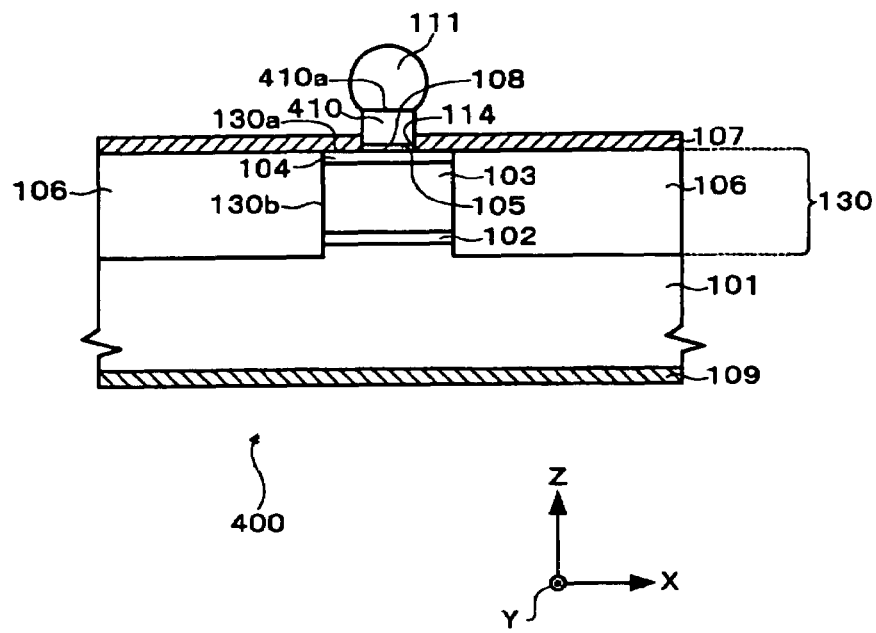
FIG. 15 is a schematic cross sectional view of the light-receiving element in a fourth exemplary embodiment of the present invention.

FIG. 15 is a schematic cross sectional view showing a light-receiving element 400 according to a fourth exemplary embodiment of the present invention. As for the exemplary embodiment, the case where the light-receiving element is a photodiode, as in the first through third exemplary embodiments, will be described.

The light-receiving element 400 of the present exemplary embodiment has almost the same structure as that of light-receiving element 100 of the first exemplary embodiment except that a base member 410 is made of a semiconductor layer. Accordingly, as for the structural elements of the light-receiving element 400, which is similar to those of the light-receiving element 100 according to the first exemplary embodiment, same reference numerals have been given, and detailed description will be omitted.

As described above, the base member 410 is composed of semiconductor layer. The semiconductor layer possesses properties that can transmit light that enters through the optical element 111. Moreover, the base member 410 can be formed integrally with the columnar part 130. Specifically, the layers composing the base member 410 is stacked by the epitaxial growth in the same way as for the columnar part 130.

As for the present exemplary embodiment, the columnar part 130 is formed by using GaAs in the manner described for the first exemplary embodiment. In this case, the base member 410 is formed from an AlGaAs material. For example, when the design waveband of the light for the light-receiving element 400 is 850 nm, the base member 410 is formed of layers containing aluminum in a proportion (mole fraction) of 5% or more. This will enable the light entering the base member 410 through the optical element 111 to pass through the base member 410 and enter the light-receiving surface 108. The "design waveband" used in the invention refers to the waveband of light that is absorbed by the light-absorbing layer.

2. Operation of the Light-Receiving Element

Because the operation of the light-receiving element 400 according to the exemplary embodiment is basically the same as that of the light-receiving element 100 according to the first exemplary embodiment, a detailed description will be omitted.

3. Method to Manufacture the Light-Receiving Element

Next, an example of the manufacturing method of the light-receiving element 400 according to the exemplary embodiment will be described referring to FIGS. 1 through 20. FIGS. 16 through 20 are schematic cross sectional views, each showing a manufacturing step of the light-receiving element 400 according to the exemplary embodiment shown in FIG. 15, and corresponding to the cross section shown in FIG. 15.

First of all, a multilayer semiconductor 150 is formed by the same method as in the step (1) (refer to FIG. 3) for the manufacturing of light-receiving element 100 in the above-described first exemplary embodiment. The multilayer semiconductor 150 has the same composition and thickness as the multilayer semiconductor 150 shown in FIG. 3.

Next, a semiconductor layer 410x is epitaxially grown over the multilayer semiconductor 150. The semiconductor layer 410x is formed of the composition described above.

Figure 16:
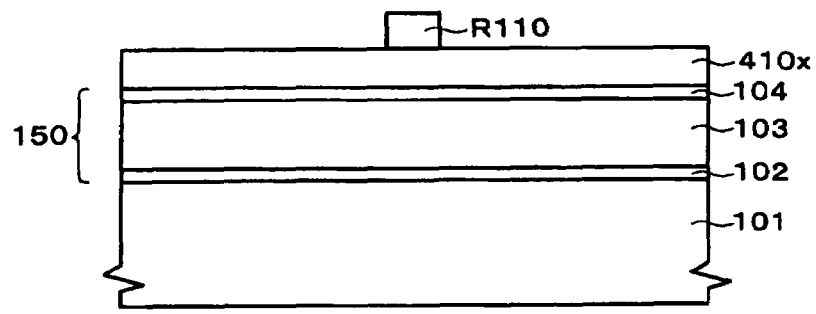
FIG. 16 is a schematic cross sectional view of a step in the manufacturing of the light-receiving element shown in FIG. 15.
Figure 17:
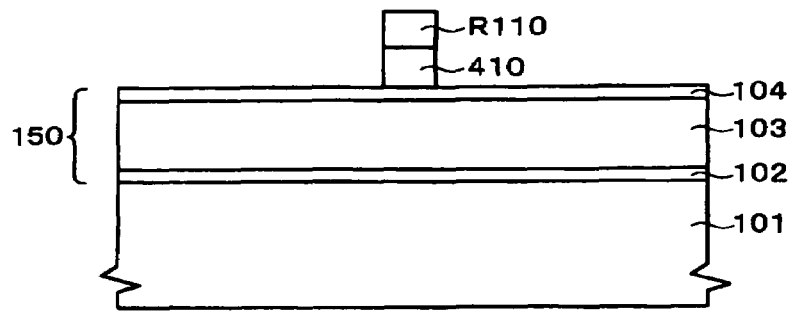
FIG. 17 is a schematic cross sectional view of a step in the manufacturing of the light-receiving element shown in FIG. 15.

Following that, a resist layer R110 with a predetermined pattern is formed on the semiconductor layer 410x, as shown in FIG. 16. The resist layer R110 is used to pattern the semiconductor layer 410x so as to form the base member 410. Then, the semiconductor layer 410x is patterned by the dry etching, for example, with the resist layer R110 used as a mask. This results in the formation of the base member 410 on the multilayer semiconductor 150, as shown in FIG. 17. Afterwards the resist layer R110 is removed.

Figure 18:
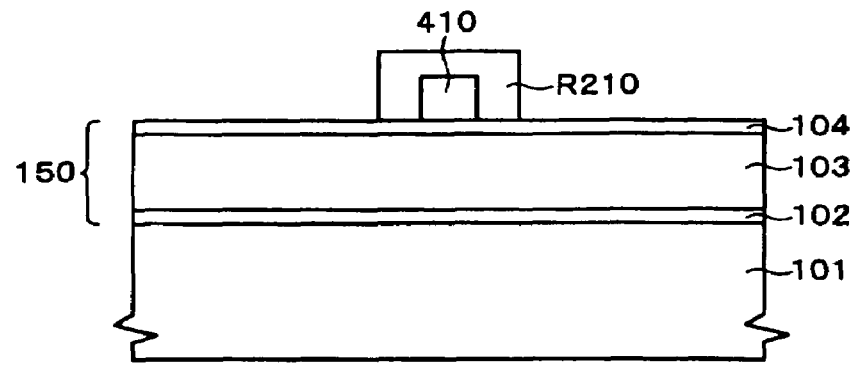
FIG. 18 is a schematic cross sectional view of a step in the manufacturing of the light-receiving element shown in FIG. 15.
Figure 19:
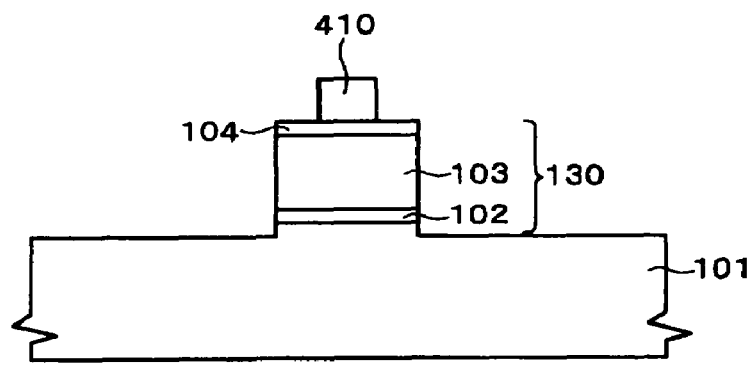
FIG. 19 is a schematic cross sectional view of a step in the manufacturing of the light-receiving element shown in FIG. 15.
Figure 20:
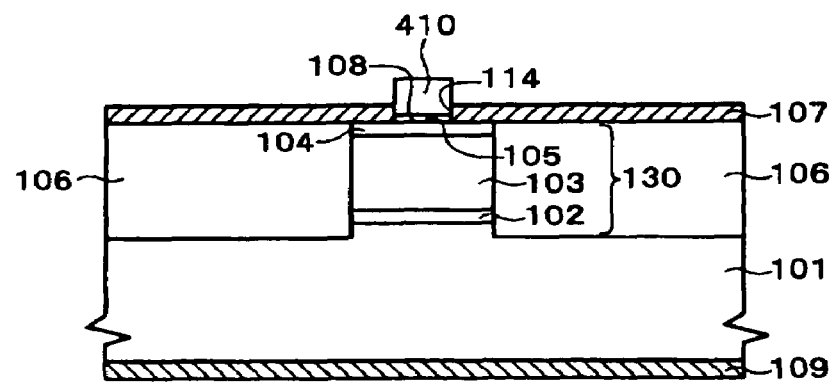
FIG. 20 is a schematic cross sectional view of a step in the manufacturing of the light-receiving element shown in FIG. 15.

Next, a resist layer R210 with a predetermined pattern is formed over the multilayer semiconductor 150, as shown in FIG. 18. The resist layer R210 is used to pattern the multilayer semiconductor 150 so as to form the columnar part 130. Then, the multilayer semiconductor 150 is patterned by the dry etching, for example, with the resist layer R210 used as a mask. This results in the formation of the columnar part 130, as shown in FIG. 19. Afterwards the resist layer R210 is removed.

Following that, the insulating layer 106 is formed around the columnar part 130 by the same methods as given in the steps (3) and (4) for the manufacturing of the light-receiving element 100 of the first exemplary embodiment. Then the first and second electrodes 107 and 109, and also the light-receiving surface 108, are formed (refer to FIG. 20).

Next, the optical element 111 (refer to FIG. 15) is formed on the base member 410 by the same methods as given in the step (6) for the manufacturing of light-receiving element 100 of the above-described first exemplary embodiment. Through the above-described steps, formation of the light-receiving element 400 is formed.

As for the present exemplary embodiment, as described above, the case where the base member 410 is formed by the first etching, and the columnar part 130 is formed by the following etching, is shown. However, the order of etching can be changed, as required. That is, after the columnar part 130 is formed by the first etching, the base member 410 may be formed by the following etching.

4. Actions and Effects

The light-receiving element 400 of the present exemplary embodiment and its manufacturing method have substantially the same actions and effects as the light-receiving element 100 of the first exemplary embodiment and its manufacturing method. Furthermore, the light-receiving element 400 of the present exemplary embodiment and its manufacturing method have the actions and effects described below.

According to the light-receiving element 400, the semiconductor layer 410x(refer to FIG. 16) is formed by epitaxial growth. This means that the thickness of the semiconductor layer 410x can be controlled with ease. Because the base member 410 is formed from the semiconductor layer 410x, the height of the base member 410 is controlled with ease.

Furthermore, because the embedding of the insulating layer 106 and the formation of the electrodes 107 and 109 are conducted after the base member 410 is formed, the effects of formation of the base member 410 to the element's characteristics can be lessened.

Fifth Exemplary Embodiment

1. Structure of the Light-Receiving Element

Figure 21:
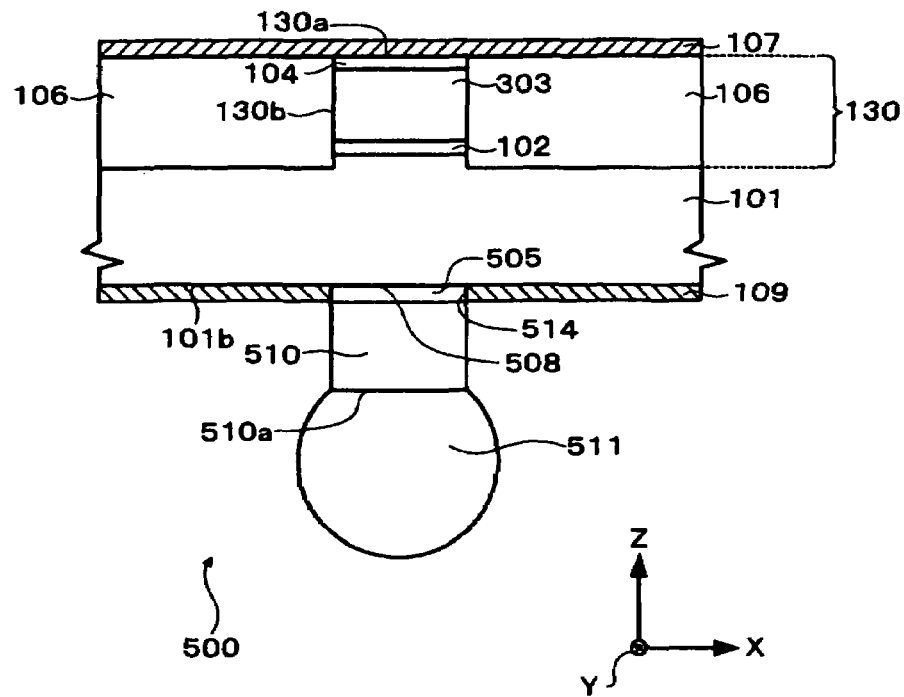
FIG. 21 is a schematic cross sectional view of the light-receiving element in a fifth exemplary embodiment of the present invention.

FIG. 21 is a schematic cross sectional view showing a light-receiving element 500 according to a fifth exemplary embodiment of the present invention. As for the exemplary embodiment, the case where the light-receiving element is a photodiode, as in the first through fourth exemplary embodiments, will be described. Accordingly, as for the structural elements of the light-receiving element 500, which is similar to those of the light-receiving element 100 according to the first exemplary embodiment, same reference numerals have been given, and a detailed description will be omitted.

The light-receiving element 500 of the present exemplary embodiment has a structure that differs from the light-receiving element of the first through fourth exemplary embodiments in that light enters through the back surface 101b of the semiconductor substrate 101 of the light-receiving element 500.

As for the light-receiving element 500, light enters through the light-receiving surface 508, which is provided on the back surface 101b of the semiconductor substrate 101. Furthermore, the base member 510 is set over the light-receiving surface 508 with an anti-reflective layer 505 interposed, and an optical element 511 is set on a top surface 510a of the base member 510. The light-receiving surface 508 is set within an opening 514 provided in the second electrode 109. That is, the plane shapes of the first and second electrodes 107 and 109 in the light-receiving element 500 differ from those of electrodes 107 and 109 in the light-receiving element 100 of the first exemplary embodiment. The base member 510 and the optical element 511 of the light-receiving element 500 are, respectively, composed of the same materials as the base member 110 and the optical element 111 of the light-receiving element 100 of the first exemplary embodiment and is formed using the same steps.

The structure of the light-receiving element 500 differs from that of light-receiving element 100 of the first exemplary embodiment (refer to FIG. 1) in that the anti-reflective layer 505 is formed on the back surface 101b of the semiconductor substrate 101. In contrast, in the light-receiving element 100, the anti-reflective layer 105 is formed on the top surface 130a of the columnar part 130. The material of the anti-reflective layer 505 is the same as that of the anti-reflective layer 105 (refer to FIG. 1).

The structure of the light-receiving element 500 further differs from the light-receiving element of the first through fourth exemplary embodiments in that it includes a light-absorbing layer 303 composed of a layer of InGaAs. In contrast, the light-receiving elements of the first through fourth exemplary embodiments include a light-absorbing layer 103 composed of a layer of GaAs.

The InGaAs layer can absorb light of wavelengths longer than the 870 nm waveband, with adjustment of the proportion of indium in the composition. Hence, by including the light-absorbing layer 303 composed of a layer of InGaAs in the light-receiving element 500, the light-receiving element, which has a design waveband exceeding 870 nm, can be designed.

As for the light-receiving element 500, the semiconductor substrate 101 are composed of a n-type GaAs layer and the first conductive type layer 102 are composed of a n-type GaAs layer. The GaAs layer does not absorb light of wavelengths 870 nm or more. Therefore, when light that is within the design waveband of the light-receiving element 500, but is longer than 870 nm in wavelength, enters through the light-receiving surface 508, the light pass through the semiconductor substrate 101 and the first conductive type layer 102 and is absorbed by the light-absorbing layer 303. Because the light is not absorbed by the semiconductor substrate 101 and the first conductive type layer 102, but is absorbed by the light-absorbing layer 303, a photodiode with outstanding light utilization efficiency is obtained.

2. Operation of the Light-Receiving Element

The operation of the light-receiving element 500 of the present exemplary embodiment is basically the same as that of the light-receiving element 100 of the first exemplary embodiment. However, as for the light-receiving element 500 of the present exemplary embodiment, the light-receiving surface 508 is set on the back surface 101b of the semiconductor substrate 101. Therefore, light that enters through the light-receiving surface 508 passes through the base member 510, the semiconductor substrate 101 and the first conductive type layer 102, and enters and is absorbed by the light-absorbing layer 303. Because all of the operations thereafter are the same as in the light-receiving elements of the first through fourth exemplary embodiments, a detailed descriptions will be omitted.

3. Method to Manufacture the Light-Receiving Element

Next, an example of the manufacturing method of the light-receiving element 500 according to the exemplary embodiment will be described.

Up until the intermediate manufacturing steps, the light-receiving element 500 of the present exemplary embodiment is formed by almost the same manufacturing steps as described above for the light-receiving element 100 of the first exemplary embodiment. Specifically, the light-receiving element 500 is formed by almost the same manufacturing steps as for the light-receiving element 100 of the first exemplary embodiment except that the light-absorbing layer 303 is composed of InGaAs, the plane shapes of the first and second electrodes 107 and 109 differ from those in the first exemplary embodiment, and the light-receiving surface 508 is formed on the back surface 101b of the semiconductor substrate 101, and the optical element 511 is set over the light-receiving surface 508 with the base member 510 interposed. Therefore aspects of the manufacturing steps for the present exemplary embodiment that differ from that for the light-receiving element of the first exemplary embodiment will be described mainly.

Specifically, as for the manufacturing steps for the light-receiving element 500 of the present exemplary embodiment, when forming the second electrode 109, a region where the semiconductor substrate 101 is exposed is created. The exposed region serves as the light-receiving surface 508.

Next, the anti-reflective layer 505 is formed by the same method as for the anti-reflective layer 105 in the light-receiving element 100 of the first exemplary embodiment.

Following that, the base member 510 is formed over the light-receiving surface 508 with the anti-reflective layer 505 interposed, and then the optical element 51 is formed on the top surface 510a of the base member 510. A detailed description of the methods for forming the first and second electrodes 107 and 109, the base member 510 and the optical element 511 is omitted, because they are the same as the methods described for the first exemplary embodiment.

4. Actions and Effects

Detailed description of the actions and effects of the light-receiving element 500 of the present exemplary embodiment and its manufacturing method are omitted, because they are substantially the same as the actions and effects of the light-receiving element 100 of the first exemplary embodiment and its manufacturing method.

Sixth Exemplary Embodiment

1. Structure of the Light-Receiving Element

Figure 22:
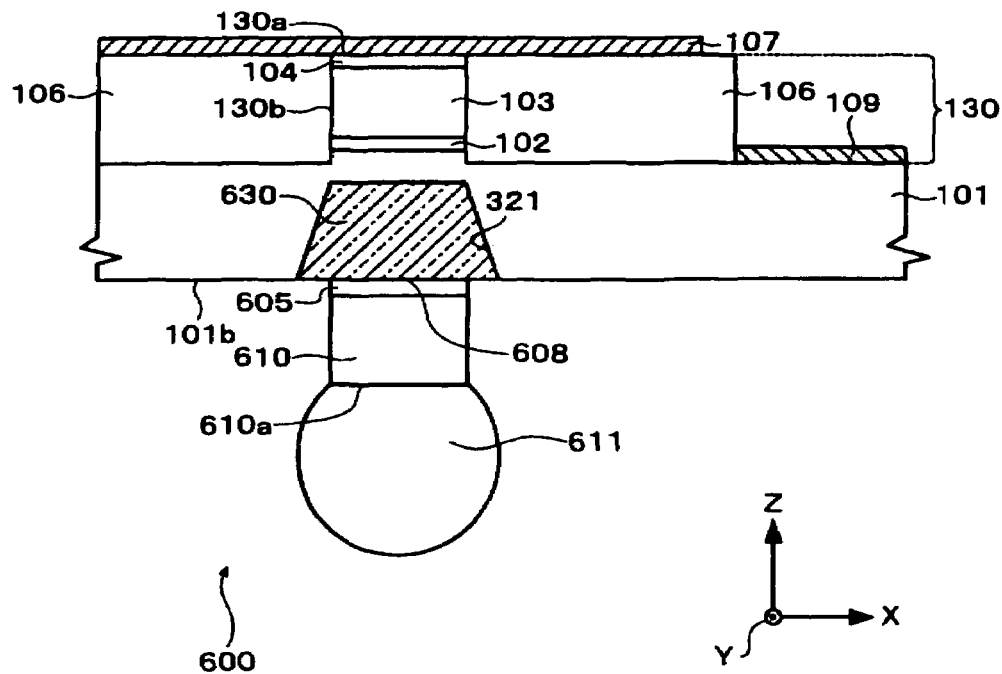
FIG. 22 is a schematic cross sectional view of the light-receiving element in a sixth exemplary embodiment of the present invention.

FIG. 22 is a schematic cross sectional view showing a light-receiving element 600 according to a sixth exemplary embodiment of the present invention. As for the exemplary embodiment, the case where the light-receiving element is a photodiode, as in the first through fifth exemplary embodiments, will be described.

The light-receiving element 600 of the present exemplary embodiment has a structure that is similar to the light-receiving element 500 of the fifth exemplary embodiment in that light enters the light-receiving element 600 through the back surface 101b of the semiconductor substrate 101 of the light-receiving element 600.

However, the structure of the light-receiving element 600 differs from that of the light-receiving element 500 of the fifth exemplary embodiment in that the light-absorbing layer 103 of the light-receiving element 600 is composed of a GaAs layer that has not been doped with impurities as in the light-receiving element 100 of the first exemplary embodiment, a recessed portion 321 set on the back surface 101b of the semiconductor substrate 101 and a light-propagating layer 630 embedded in the recessed portion 321 of the light-receiving element 600, the first electrode 107 and second electrode 109 of the light-receiving element 600 are both formed above the semiconductor substrate 101, and a light-receiving surface 608 of the light-receiving element 600 is set on the top surface of the light-propagating layer 630.

As for the other structures and functions of the components, the light-receiving element 600 has structures and functions that are almost the same as those of the light-receiving element 500 of the fifth exemplary embodiment. Accordingly, as for the structural elements of the light-receiving element 600, which is similar to that of the light-receiving element 500 according to the fifth exemplary embodiment, same reference numerals have been given, and detailed description for them will be omitted.

The base member 610 and the optical element 611 of the light-receiving element 600 are, respectively, composed of the same materials as the base member 110 and optical element 111 of the light-receiving element 100 of the first exemplary embodiment, and is formed by the same steps. Furthermore, an anti-reflective layer 605 is composed of the same materials as the anti-reflective layer 505 in the fifth exemplary embodiment, and is formed by the same steps.

The light-receiving element 600 is provided with a recessed portion 321 on the back surface 101b of the semiconductor substrate 101, and a light-propagating layer 630 is embedded in the recessed portion 321. That is, as shown in FIG. 22, the light-propagating layer 630 is formed between the semiconductor substrate 101 and the base member 610. The width and thickness of the light-propagating layer 630 can be controlled by adjusting the width and depth of the recessed portion 321.

The light-propagating layer 630 is formed of a material that does not absorb light of a predetermined wavelength within a design waveband of the light-receiving element 600. For example, if the light-receiving element 600 is actuated upon receiving light of wavelength of 850 nm, the light-propagating layer 630 is formed of a material that does not include the wavelength of 850 nm in its absorption waveband. Hence, light of wavelength of 850 nm that enters through the light-receiving surface 608 is introduced to the light-absorbing layer 103 without being absorbed by the light-propagating layer 630.

The light-receiving element 600 can be applied to, for example, cases which introduce light from the back surface 101b of the substrate 101 into the light-absorbing layer 103 when the absorption waveband of the substrate 101 includes the design waveband of the light-receiving element 600.

Furthermore, as for the light-receiving element 600, the base member 610 is formed over the light-receiving surface 608 with the anti-reflective layer 605 interposed, and the optical element 611 is formed on the top surface 610a of the base member 610. As for the light-receiving element 600, the path length for the light that is introduced to the light-absorbing layer 103 can be adjusted by adjusting the thickness of the base member 610 and the light-propagating layer 630. That is, with respect to a particular incidence angle of an incident light, the curvature of the optical element 611, and the path length for the light that is introduced to the light-absorbing layer 103, can be independently controlled. Because of this, an optical design that introduces the light efficiently to the light-absorbing layer can be conducted with ease.

2. Operation of the Light-Receiving Element

The operation of the light-receiving element 600 of the present exemplary embodiment is basically the same as that of the light-receiving element 500 of the fifth exemplary embodiment. As for the light-receiving element 600 of the present exemplary embodiment, because the light-propagating layer 630 is provided between the semiconductor substrate 101 and the base member 610, light that enters through the light-receiving surface 608 is introduced to the light-absorbing layer 303 through the base member 610, the light-propagating layer 630, the semiconductor substrate 101 and the first conductive type layer 102. Because all of the operations thereafter are the same as in the light-receiving elements of the first through fifth exemplary embodiments, detailed descriptions will be omitted.

3. Method to Manufacture the Light-Receiving Element

The light-receiving element 600 of the present exemplary embodiment is formed by almost the same manufacturing steps as for the light-receiving element 500 of the fifth exemplary embodiment except that the first electrode 107 and second electrode 109 of the light-receiving element 600 are both formed above the semiconductor substrate 101, and that a recessed portion 321 is formed on the back surface 101b of the semiconductor substrate 101 of the light-receiving element 600, and the light-propagating layer 630 is embedded in the recessed portion 321 of the light-receiving element 600. Accordingly, a detailed description will be omitted.

To form the recessed portion 321, for example, the dry etching method, the wet etching method or a combination of the two can be employed. The method to be used to form the light-propagating layer 630 depends on the material used for it. When a resin material that is curable by the application of energy is used, the spin coating method, dispenser method, inkjet method or similar method can be employed to form the resin precursor inside the recessed portion 321, and the precursor is subsequently caused to cure.

4. Actions and Effects

The light-receiving element 600 of the present exemplary embodiment and its manufacturing method have substantially the same actions and effects as light-receiving element 100 of the first exemplary embodiment and its manufacturing method. Furthermore, the light-receiving element 600 of the present exemplary embodiment and its manufacturing method have the actions and effects described below.

According to the light-receiving element 600 of the present exemplary embodiment, because the light-propagating layer 630 is formed between the semiconductor substrate 101 and the base member 610, the angle of radiation of the incident light can be controlled. That is, by appropriately selecting a material to form the light-propagating layer 630, the refractive factor of the light-propagating layer 630 can be adjusted.

Seventh Exemplary Embodiment

1. Structure of the Light-Receiving Element

Figure 23:
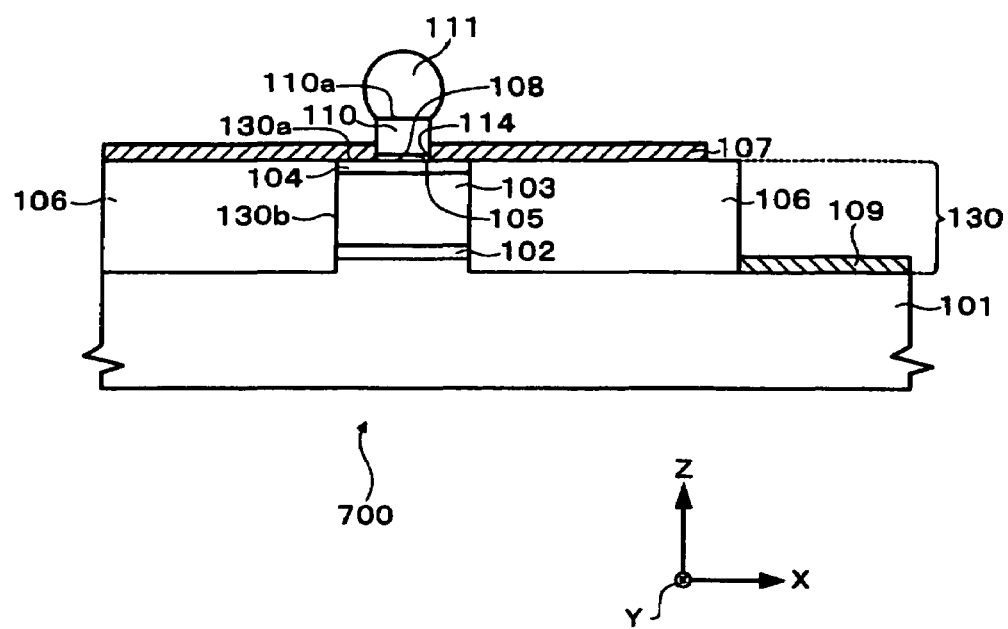
FIG. 23 is a schematic cross sectional view of the light-receiving element in a seventh exemplary embodiment of the present invention.
Figure 24:
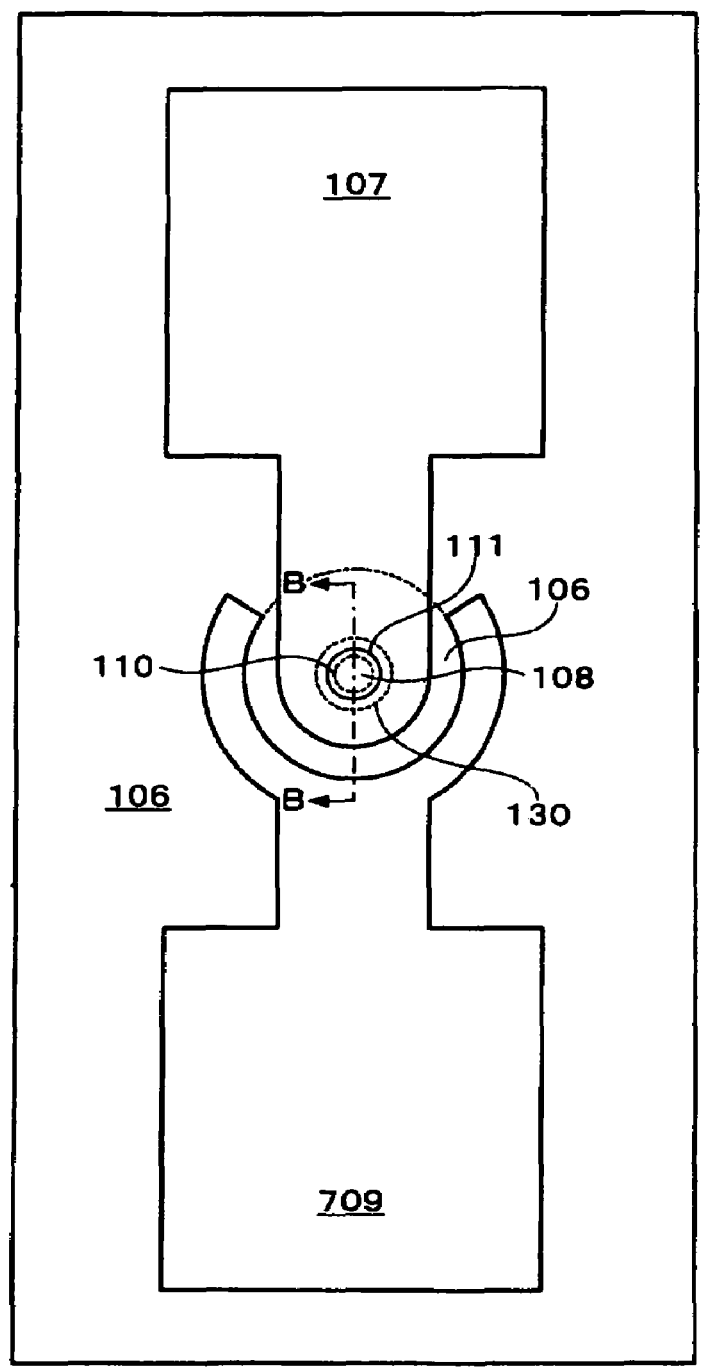
FIG. 24 is a schematic plan view of the light-receiving element in the seventh exemplary embodiment of the present invention.

FIG. 23 is a schematic cross sectional view showing a light-receiving element 700 according to a seventh exemplary embodiment of the present invention. FIG. 24 shows the cross section on plane B-B in FIG. 24. As for the exemplary embodiment, the case where the light-receiving element is a photodiode, as in the first through sixth exemplary embodiments, will be described. Accordingly, as for the structural elements of the light-receiving element, which is similar to that of the light-receiving element 100 according to the first exemplary embodiment, same reference numerals have been given, and detailed description for them will be omitted.

As shown in FIGS. 23 and 24, as for the light-receiving element 700 of the present exemplary embodiment, the first and second electrodes 107 and 109 are both set over the semiconductor substrate 101.

Specifically, the first electrode 107 is formed from the top surface 130a of the columnar part 130 and to the top surface of the insulating layer 106, while a portion of the insulating layer 106 is eliminated so as to expose the semiconductor substrate 101, and the second electrode 109 is formed on the exposed top surface of the semiconductor substrate 101.

2. Operation of the Light-Receiving Element

Because the operation of the light-receiving element 700 according to the exemplary embodiment is similar to that of the light-receiving element 100 according to the first exemplary embodiment, a detailed description will be omitted.

3. Method to Manufacture the Light-Receiving Element

A manufacturing method of the light receiving element 700 according to the exemplary embodiment is similar to that of the light receiving element 100 according to the first exemplary embodiment except that its first electrode 107 and second electrode 109 are both formed over its semiconductor substrate, and that a portion of its insulating layer 106 is eliminated. Accordingly, a detailed description will be omitted.

4. Actions and Effects

The light receiving element 700 according to the exemplary embodiment and its manufacturing method have substantially the same actions and effects as the light-receiving element 100 according to the first exemplary embodiment and its manufacturing method. Accordingly, a detailed description will be omitted.

Eighth Exemplary Embodiment

Figure 25:
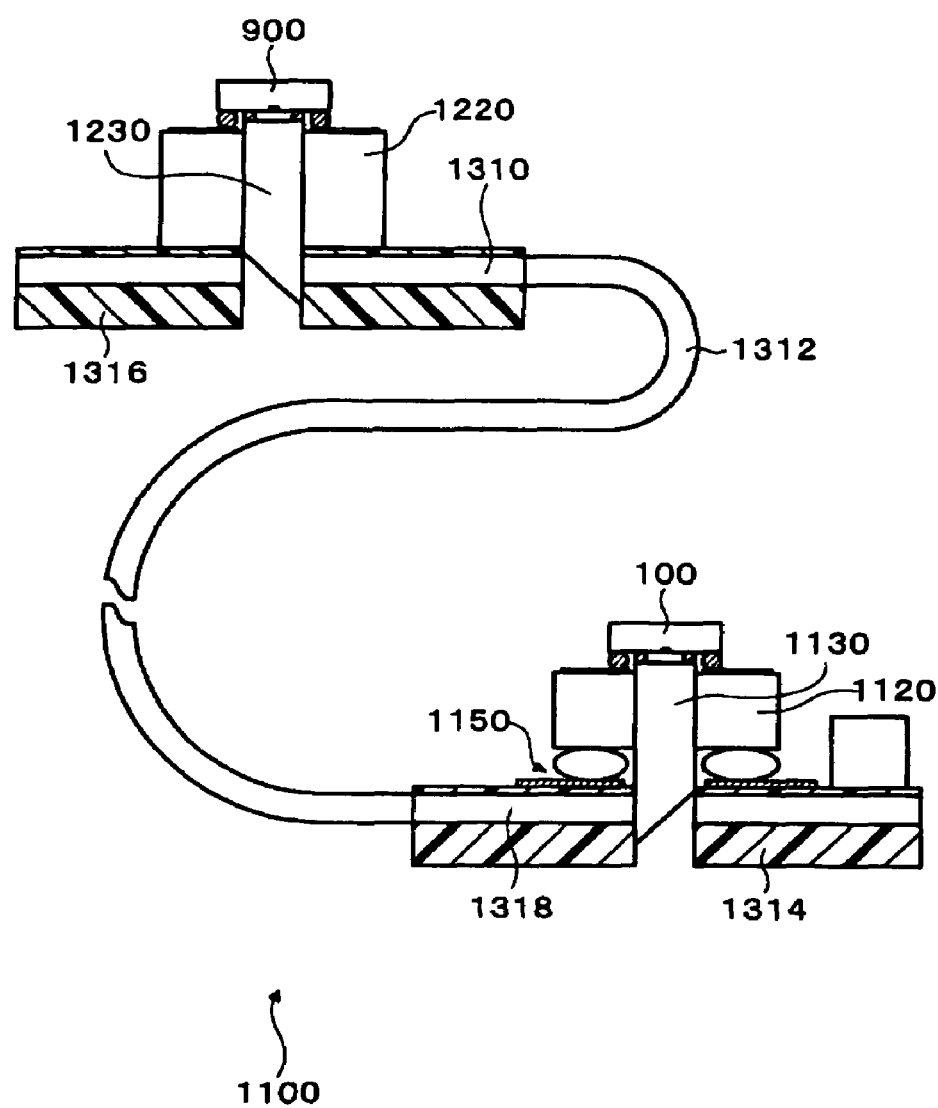
FIG. 25 is a schematic view of the optical module relating to a eighth exemplary embodiment of the present invention.

FIG. 25 is a schematic diagram showing an optical transmitting device according to a eighth exemplary embodiment of the present invention. An optical transmitting device 1100 according to the exemplary embodiment includes the light-receiving element 100 according to the first exemplary embodiment, a light-emitting element 900, and light guides to propagate light emitted from the light-emitting element 900 and introducing the light to the light-receiving element 100. In addition, an optical module includes the light-receiving element 100 and the light guide (first light guide 1130) to propagate light to be introduced to the light receiving element 100.

According to the exemplary embodiment, a third light guide 1312 is arranged between a structure of the light-receiving element 100 part (including the light-receiving element 100, a platform 1120, a first light guide 1130, a second light guide 1318 and an actuator 1150) and a structure of the light emitting-element 900 part (including the light emitting element 900, a platform 1220, and third light guides 1230 and 1310). By using an optical fiber or the like for the third light guide 1312, the optical transmission between a plurality of electronic devices can be conducted.

As for the optical transmitting device 1100 according to the exemplary embodiment, after light emits from the light emitting element 900, the light propagates into the third light guides 1312, 1310 and 1230, the second light guide 1312 and the first light guide 1130 and then is introduced to the light receiving element 100.

Figure 26:
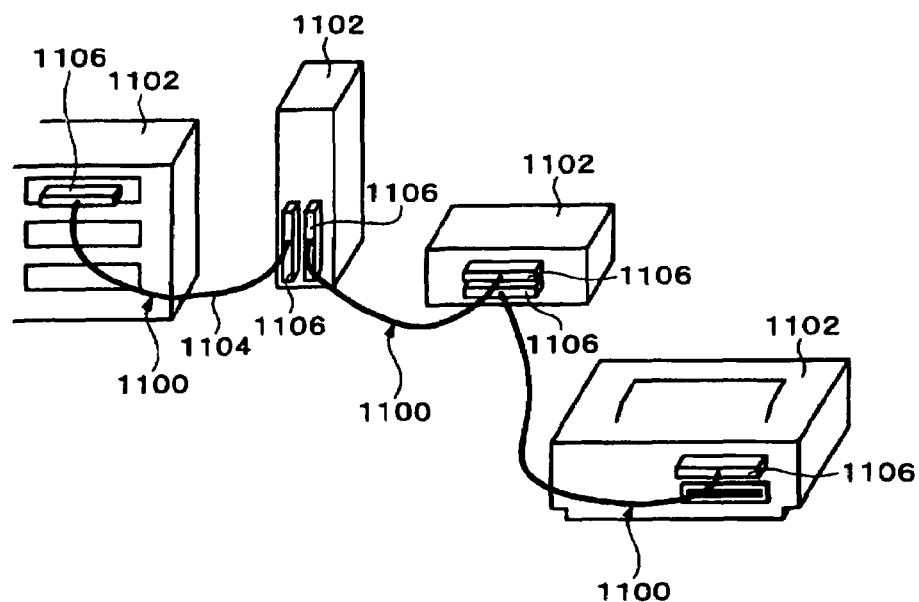
FIG. 26 is a schematic illustration of the optical transmitting device relating to the eighth exemplary embodiment of the present invention.

For example, as show in FIG. 26, the optical transmitting device 1100 connects electronic devices 1102, such as a computer, a display, a storage device and a printer with each other. The electronic device 1102 may be an information and communication device. The optical transmitting device 1100 includes a cable 1104 having the third light guide 1312 of an optical fiber or the like. As for the optical transmitting device 1100, plugs 1106 may be provided at both ends of the cable 1104. Within each of the plugs 1106, the structures of the light-receiving element 100 part and the light-emitting element 900 part are provided. An electric signal output from one of the electronic devices 1102 is converted into a light signal by the light-emitting element and the light signal is transmitted through the cable 1104 to be converted to an electric signal by the light-receiving element. Then the electric signal is input to another electronic device 1102. In this manner, according to the optical transmitting device 1100 of the exemplary embodiment, information can be transmitted in light signal between the electronic devices 1102.

Figure 27:
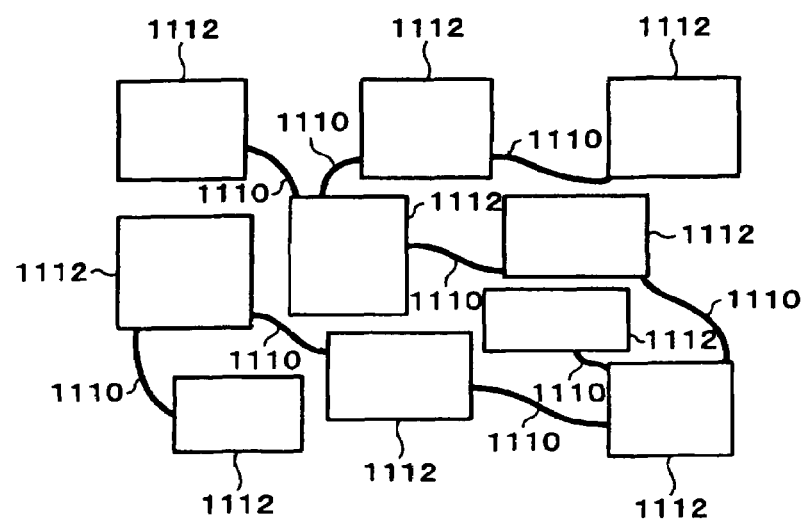
FIG. 27 is an another schematic illustration of the optical transmitting device relating to the eighth exemplary embodiment of the present invention.

FIG. 27 shows a schematic for a usage of the optical transmitting device according to the exemplary embodiments of the present invention. An optical transmitting device 1112 provides a connection between electronic devices 1110. The electronic device 1110 includes a liquid crystal display monitor or digital adaptive CRT (which may be used in finance, teleshopping, medical service, and education fields), a liquid crystal projector, a plasma display panel (PDP), a digital TV, a cash register in a retail store (for POS (Point of Sale Scanning)), a video, a tuner, a game device, a printer, and the like.

As for the exemplary embodiments (refer to FIGS. 25 through 27), even the case where the light receiving elements according to the second through seventh exemplary embodiments are used instead of the light receiving element 100 according to the first exemplary embodiment, similar actions and effects can be performed.

That is, the present invention is not limited to the above-described exemplary embodiments and various modifications is made. For example, the present invention includes a substantially same structure (e.g. a structure having the same functions, methods and results or a structure having the same purpose and results) as those described in the exemplary embodiments. Furthermore, the present invention includes a structure obtained by replacing an unessential part in the structures described in the exemplary embodiments. Still furthermore, the present invention includes a structure having the same actions and effects or a structure capable of achieving the same purpose as those described in the exemplary embodiments. Still furthermore, the present invention includes a structure in which the publicly known art is added to the structures described in the exemplary embodiments.

For example, in the above-described exemplary embodiments, the p-type and n-type of each semiconductor layer may be counterchanged without departing from the intent of the present invention. Furthermore, as for the above-described exemplary embodiments, the light-receiving element having one columnar part are described, but providing a plurality of columnar parts on the substrate surface does not impair the exemplary embodiments of the present invention. Alternatively, even if a plurality of light-receiving elements are arrayed, similar actions and effects can be achieved.

Furthermore, in the above-described exemplary embodiments, for example, the cases using AlGaAs-based and InGaAs-based semiconductor materials are described, but other materials, for example, Si-based or GaInNAs-based semiconductor materials can be used in accordance with the wavelength of light absorbed in the light-absorbing layer.

What is claimed is:

1. A light receiving element comprising:
   a substrate;
   a first conductive layer formed above the substrate;
   a light absorbing layer formed above the first conductive layer;
   a second conductive layer formed above the light absorbing layer, the first conductive layer, the light absorbing layer and the second conductive layer constituting a columnar section;
   a first electrode formed above the second conductive layer, the first electrode having an opening section forming a light-receiving surface;
   a base member formed above the light receiving surface, a top surface of the base member having a first shape; and
   an optical element formed above the base member, the optical element configured to have the first shape of the base member, and a diameter of the optical element being larger than a diameter of the base member.

2. The light receiving element according to claim 1, the first shape being a circular or elliptical shape.

3. The light receiving element according to claim 1, the base member being made of material that passes light of a predetermined wavelength.

4. The light receiving element according to claim 1, the optical element functioning as a lens.

5. The light receiving element according to claim 1, the optical element functioning as a polarizing element.

6. The light receiving element according to claim 1, further comprising:
   an anti-reflective layer formed on the light receiving surface;
   a sealing agent formed on a part of the optical element and on a part of the base member;
   an insulating layer formed surrounding a portion of the columnar section; and
   a second electrode formed on a side of the substrate where the optical element not being formed.

7. The light receiving element according to claim 1, the top surface of the base member further including a second shape, the second shape being a curve.

8. The light receiving element according to claim 1, an upper portion of the base member formed in a shape of an inverse taper.

9. The light receiving element according to claim 1, the light receiving element being a photodiode.

10. An optical module comprising:
    the light receiving element according to claim 1; and
    a light guide.

11. An optical transmitting device comprising the optical module according to claim 10.

12. A light receiving element comprising:
    a substrate having a first surface and a second surface;
    a first conductive layer;
    a light absorbing layer;
    a second conductive layer, the light absorbing layer formed between the first conductive layer and the second conductive layer, and the first conductive layer, the light absorbing layer, and the second conductive layer constituting a columnar section;
    a first electrode, the columnar section formed between the first electrode and the first surface of the substrate;
    a light receiving portion formed on the second surface of the substrate;
    a base member, a top surface of the base member having a first shape; and
    an optical element configured to have the first shape of the base member, a diameter of the optical element being larger than a diameter of the base member, and the base member formed between the light receiving portion and the optical element.

13. The light receiving element according to claim 12, further comprising:
    a recessed portion formed in the substrate between the light receiving portion and the first conductive layer.

14. The light receiving element according to claim 13, the recessed portion including a light propagating layer.

15. The light receiving element according to claim 12, further comprising:

an insulating layer formed between the first surface of the substrate and the first electrode, and surrounding the columnar section.

16. The light receiving element according to claim 12, further comprising:

a second electrode formed on the second surface of the substrate, the second electrode having an opening section corresponding to the light receiving portion.

17. The light receiving element according to claim 12, further comprising:

an anti-reflective layer formed between the light receiving portion and the base member.

* * * * *